United States Patent
Masuzawa et al.

(10) Patent No.: US 12,322,709 B2
(45) Date of Patent: Jun. 3, 2025

(54) SEMICONDUCTOR DEVICE AND LASER MARKING METHOD

(71) Applicant: Nuvoton Technology Corporation Japan, Kyoto (JP)

(72) Inventors: Kosuke Masuzawa, Kyoto (JP); Hiroshi Yoshida, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 37 days.

(21) Appl. No.: 18/567,317

(22) PCT Filed: Jul. 6, 2022

(86) PCT No.: PCT/JP2022/026880
§ 371 (c)(1),
(2) Date: Dec. 5, 2023

(87) PCT Pub. No.: WO2023/139813
PCT Pub. Date: Jul. 27, 2023

(65) Prior Publication Data
US 2024/0332205 A1    Oct. 3, 2024

Related U.S. Application Data

(60) Provisional application No. 63/300,787, filed on Jan. 19, 2022.

(51) Int. Cl.
*H01L 23/544*    (2006.01)
*B23K 26/073*    (2006.01)
(Continued)

(52) U.S. Cl.
CPC .......... *H01L 23/544* (2013.01); *B23K 26/073* (2013.01); *B23K 26/18* (2013.01);
(Continued)

(58) Field of Classification Search
CPC ........ H01L 23/544; H01L 2223/54406; B23K 26/073; B23K 26/18; B23K 26/40; B23K 2101/007; B23K 2101/40; G09F 7/165
See application file for complete search history.

(56) References Cited

U.S. PATENT DOCUMENTS 6,143,587 A    11/2000    Omizo
6,774,340 B1    8/2004    Chiba et al.
(Continued)

FOREIGN PATENT DOCUMENTS

JP    11-156565 A    6/1999
JP    2000-223382 A    8/2000
(Continued)

OTHER PUBLICATIONS

International Search Report received in International Application No. PCT/JP2022/026880, dated Sep. 6, 2022.
(Continued)

*Primary Examiner* — Brian W Jennison
*Assistant Examiner* — Kristina J Babinski
(74) *Attorney, Agent, or Firm* — Rimon P.C.

(57) ABSTRACT

A semiconductor device that is a facedown mountable, chip-size-package type semiconductor device, the semiconductor device including: a semiconductor substrate; and a metal layer that is disposed on the semiconductor substrate and is exposed to outside. One or more marks are provided on an exposed surface of the metal layer. The one or more marks each include an outline portion defining an outline of the mark, and a central portion located inward of the outline portion. In a plan view of the exposed surface of the metal layer, the outline portion has a color different from at least one of a color of the central portion or a color of a base portion that is a portion of the exposed surface of the metal layer on which the one or more marks are not provided.

13 Claims, 15 Drawing Sheets

(51) Int. Cl.
　　　*B23K 26/18*　　　(2006.01)
　　　*B23K 26/40*　　　(2014.01)
　　　*B23K 101/00*　　(2006.01)
　　　*B23K 101/40*　　(2006.01)
　　　*G09F 7/16*　　　(2006.01)

(52) U.S. Cl.
　　　CPC .............. *B23K 26/40* (2013.01); *G09F 7/165* (2013.01); *B23K 2101/007* (2018.08); *B23K 2101/40* (2018.08); *H01L 2223/54406* (2013.01)

(56) References Cited

U.S. PATENT DOCUMENTS

| 2014/0027412 | A1 | 1/2014 | Kato et al. | |
| 2017/0323907 | A1* | 11/2017 | Kitagawa | H01L 29/78693 |
| 2020/0395479 | A1* | 12/2020 | Fujioka | H01L 29/7813 |

FOREIGN PATENT DOCUMENTS

| JP | 2001118945 A | 4/2001 |
| JP | 2008-012567 A | 1/2008 |
| JP | 2011-136347 A | 7/2011 |
| JP | 2016139642 A | 8/2016 |
| WO | 2012132653 A1 | 10/2012 |
| WO | 2019244383 A1 | 12/2019 |

OTHER PUBLICATIONS

International Preliminary Report on Patentability Chapter II (IPRP2) issued on Jun. 13, 2023 in International (PCT) Application No. PCT/JP2022/026880 with its English translation.

* cited by examiner

FIG. 7
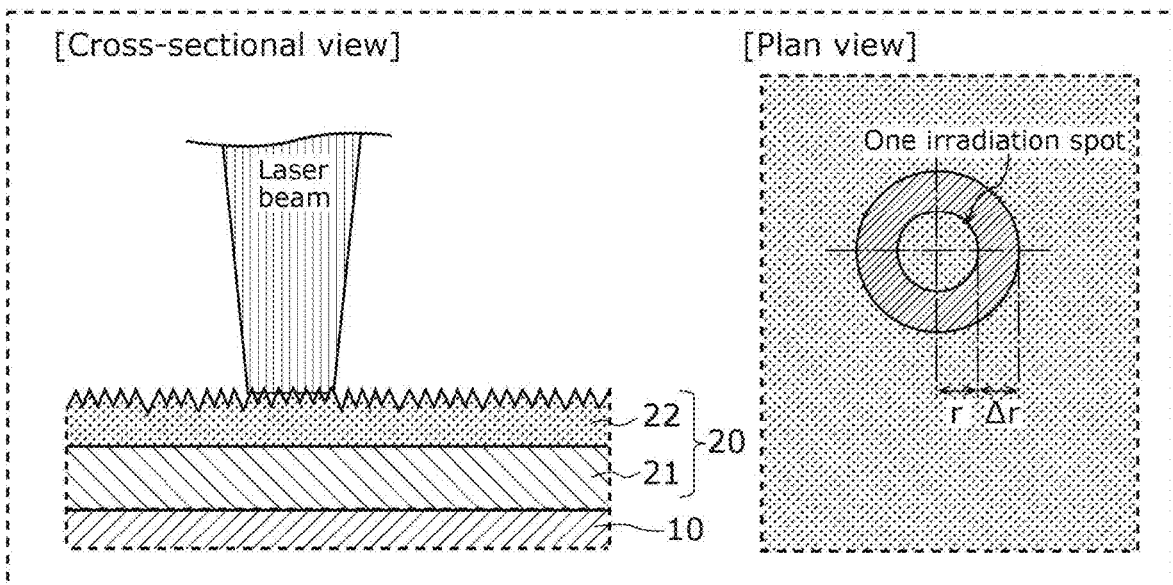
(a)
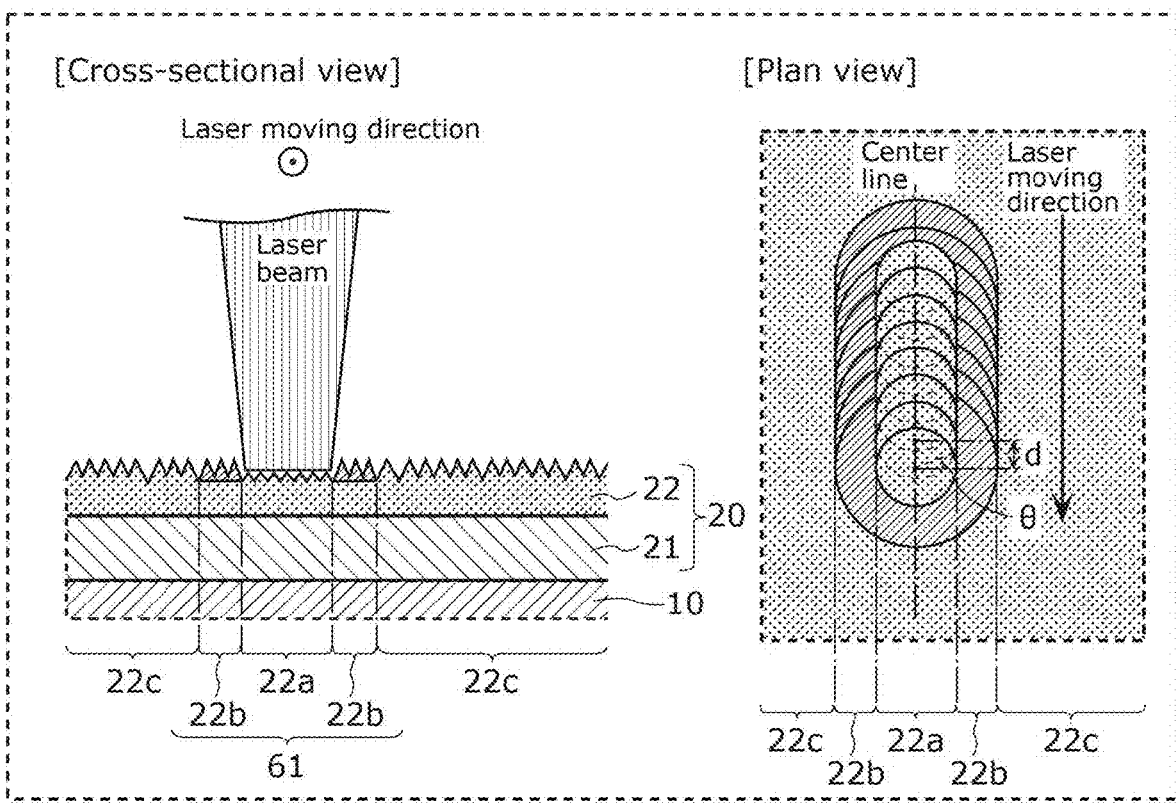
(b)

FIG. 8
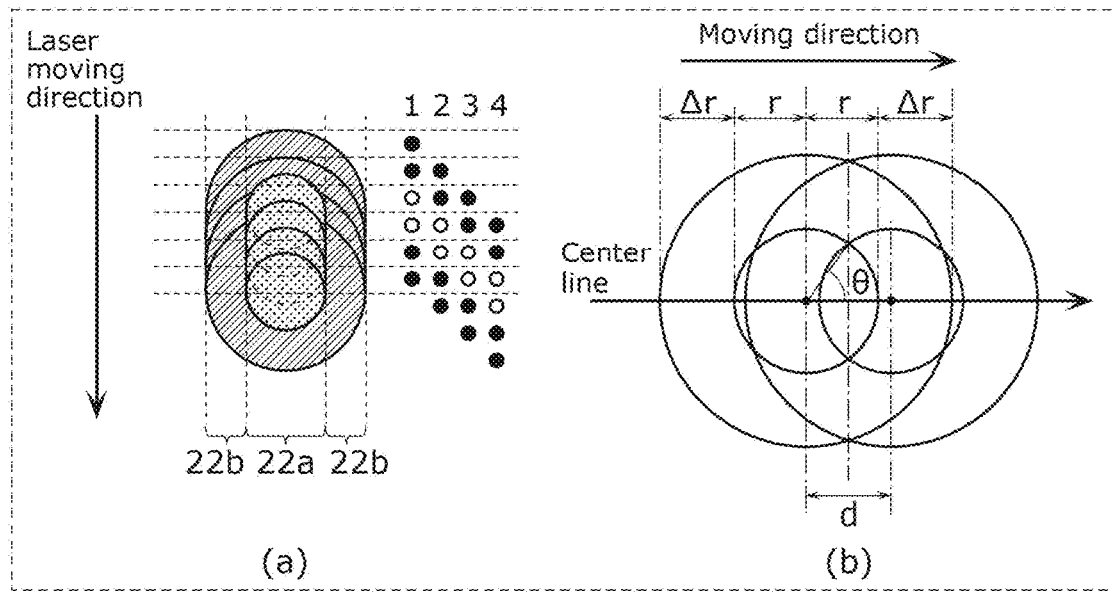
FIG. 9
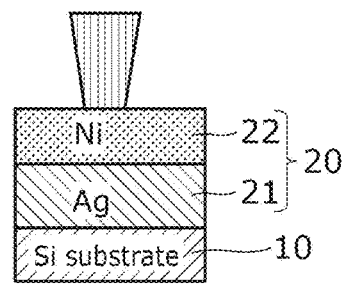
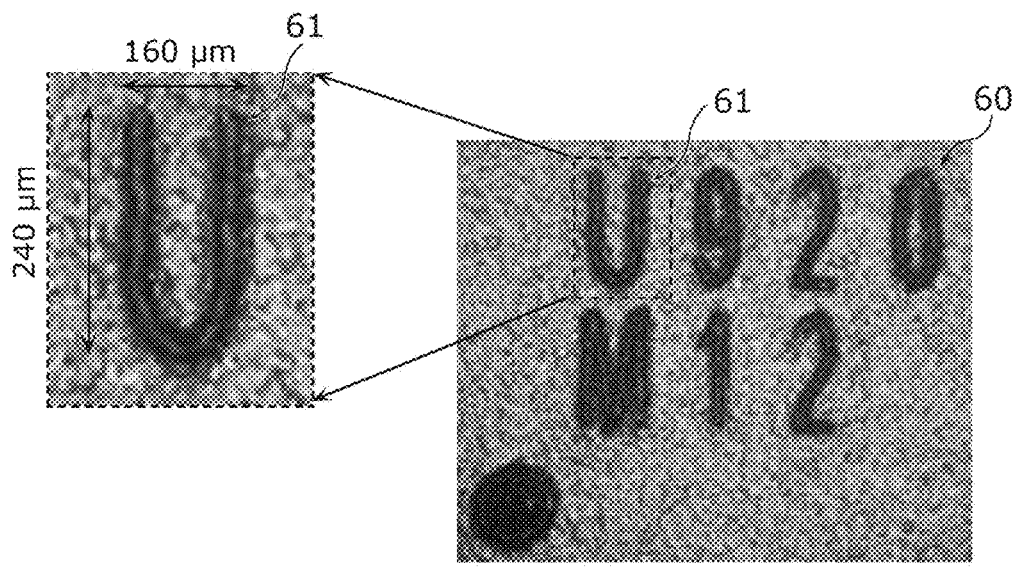

[Conventional method A]

[Conventional method A]

[Micrograph]　　[Automatic exterior inspection camera image]

[Conventional method A]

[EDX quantitative analysis]

| Measurement position | Oxygen mass concentration (%) |
|---|---|
| P1 | 0 |
| P2 | 0 |
| P3 | 0 |
| P4 | 0 |
| P5 | 0 |
| P6 | 0 |
| P7 | 0 |

[Conventional method B]

[Conventional method B]

[Micrograph]   [Automatic exterior inspection camera image]

[Conventional method B]

[EDX mapping]

FIG. 18
[Disclosed method]
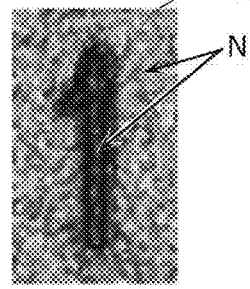
[Micrograph]
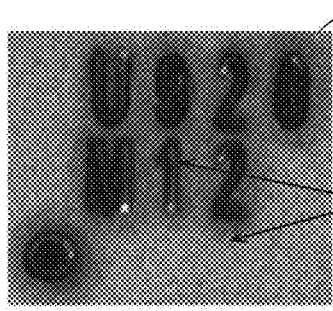
[Automatic recognition image]
FIG. 19
[Disclosed method (Left in the air for one month)]
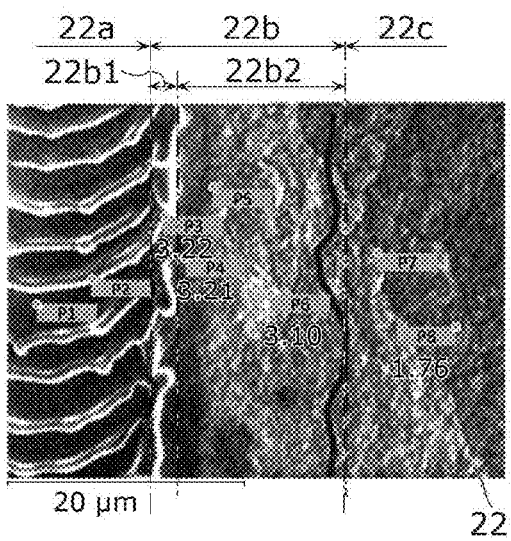
[EDX quantitative analysis]
| Measurement position | Oxygen mass concentration (%) | |
|---|---|---|
| P1 | 0 | 22a |
| P2 | 0 | 22a |
| P3 | 3.22 | 22b1 |
| P4 | 3.21 | 22b2 |
| P5 | 0 | 22b2 |
| P6 | 3.10 | 22b2 |
| P7 | 0 | 22c |
| P8 | 1.76 | 22c |
FIG. 20
[Disclosed method (Left in the air for six months)]
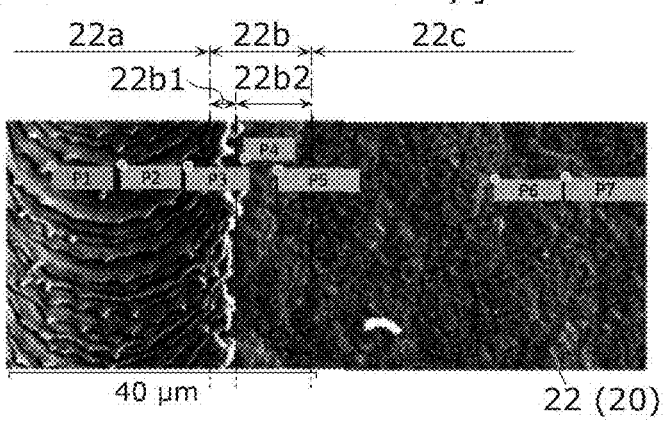
[EDX quantitative analysis]
| Measurement position | Oxygen mass concentration (%) | |
|---|---|---|
| P1 | 2.50 | 22a |
| P2 | 2.65 | 22a |
| P3 | 2.21 | 22a |
| P4 | 4.17 | 22b |
| P5 | 3.21 | 22b |
| P6 | 1.67 | 22c |
| P7 | 1.64 | 22c |

FIG. 21
[Conventional method A (Topmost surface layer: Ni)]
[Low roughness of base portion]
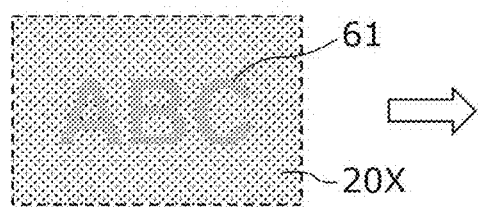
[Micrograph]
Visibility ✕
[High roughness of base portion]
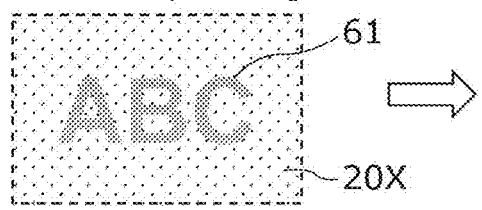
[Micrograph]
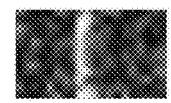
Visibility ◯
FIG. 22
[Disclosed method (Topmost surface layer: Ni)]
[Low roughness of base portion]
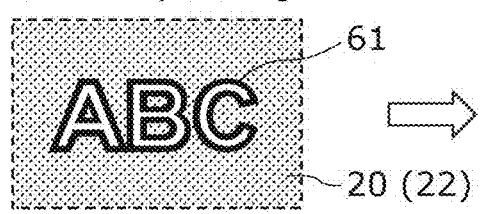
[Micrograph]
Visibility ◯
[High roughness of base portion]
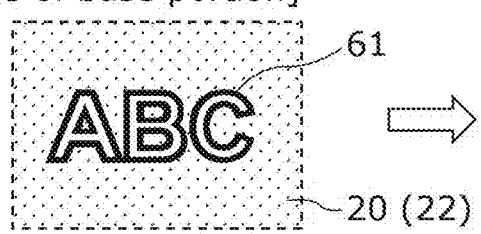
[Micrograph]
Visibility ◯

FIG. 23
[One marking line]
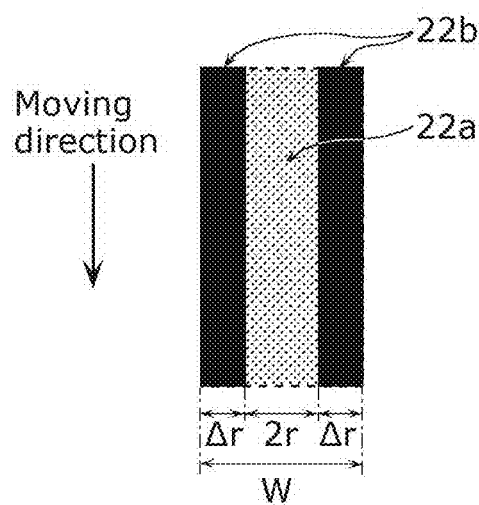
[One letter]
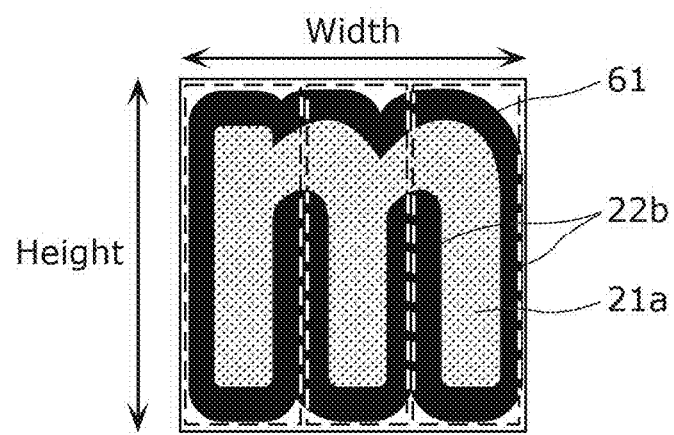

SEMICONDUCTOR DEVICE AND LASER MARKING METHOD

This application is the U.S. National Phase under 35 U.S.C. § 371 of International Application No. PCT/JP2022/026880, filed on Jul. 6, 2022, which claims the benefit of U.S. Provisional Patent Application No. 63/300,787, filed on Jan. 19, 2022, the entire contents of each of which are hereby incorporated by reference.

TECHNICAL FIELD

The present disclosure relates to a semiconductor device including a metal layer on which a laser mark is provided, and a laser marking method for providing a laser mark on a metal layer.

BACKGROUND ART

A laser marking method for providing laser marks such as letters and numbers by radiating a laser beam to an exposed surface of a semiconductor device has been proposed (e.g., Patent Literature (PTL) 1).

A technique for providing laser marks such as letters or numbers on a metal layer (e.g., an electrode) or a semiconductor substrate of a semiconductor device by radiating a laser beam to the metal layer or the semiconductor substrate to partially etch an exposed surface of the metal layer or the semiconductor substrate is known as this type of the laser marking method. The laser marks thus provided can be recognized by a user due to the contrast of irregularities between portions (letter portions) etched by the laser beam irradiation and portions unetched without the laser beam irradiation.

In this case, when a target on which laser marks are provided (a marking target) is a metal layer containing a metal material having a relatively low melting point such as copper or silver, or a semiconductor substrate including a silicon substrate, it is possible to provide irregularities by etching the surface layer of the marking target by a laser beam regardless of the thickness of the metal layer or the semiconductor substrate. In other words, it is possible to provide recognizable laser marks on the marking target.

On the other hand, when a metal layer that is a marking target contains a metal material having a high melting point such as nickel, although it is difficult to etch the metal layer by a laser beam, in the case where the metal layer is thin, it is possible to expose a foundation layer provided below the metal layer by etching the metal layer by a laser beam. Accordingly, the contrast due to the difference in surface reflectance between the metal layer and the foundation layer allows a user to recognize the laser marks.

CITATION LIST

Patent Literature

[PTL 1] Japanese Unexamined Patent Application Publication No. 11-156565

SUMMARY OF INVENTION

Technical Problem

However, when a metal layer that is a marking target contains a metal material having a high melting point and is thick, it may be impossible to etch the metal layer until a foundation layer provided below the metal layer is exposed, even by radiating a laser beam thereto, and it may be impossible to provide recognizable laser marks on the metal layer.

The present disclosure has been conceived to solve such a problem, and has an object to provide, for example, a laser marking method that makes it possible to provide a recognizable laser mark on a metal layer even when the metal layer is difficult to etch by a laser beam, and a semiconductor device including the metal layer on which the laser mark is provided.

Solution to Problem

In order to achieve the above object, a semiconductor device according to one aspect of the present disclosure is a facedown mountable, chip-size-package type semiconductor device, the semiconductor device comprising: a semiconductor substrate; and a metal layer that is disposed on the semiconductor substrate and is exposed to outside, wherein one or more marks are provided on an exposed surface of the metal layer, the one or more marks each include an outline portion defining an outline of the mark, and a central portion located inward of the outline portion, and in a plan view of the exposed surface of the metal layer, the outline portion has a color different from at least one of a color of the central portion or a color of a base portion that is a portion of the exposed surface of the metal layer on which the one or more marks are not provided.

A laser marking method according to one aspect of the present disclosure is a laser marking method for providing a mark on an exposed surface of a metal layer, the laser marking method comprising: sequentially pulse radiating a laser beam to the exposed surface of the metal layer under a prescribed condition to cause a first action and a second action in parallel, and providing the mark including an outline portion and a central portion, the first action increasing a degree of oxidization of the outline portion defining an outline of the mark, compared to a base portion that is in the exposed surface of the metal layer and unaffected by the radiation of the laser beam, the second action decreasing a degree of oxidization of the central portion of the mark located inward of the outline portion, compared to the base portion in the exposed surface of the metal layer.

Advantageous Effects of Invention

It is possible to provide a recognizable laser mark on a metal layer even when the metal layer is difficult to etch by a laser beam.

BRIEF DESCRIPTION OF DRAWINGS

FIG. 7 is a diagram for describing a laser marking method according to the embodiment.

FIG. 8 is a diagram illustrating a first action and a second action for each laser irradiation spot of a laser beam that is pulse radiated.

FIG. 9 is a diagram illustrating a laser mark actually provided on a metal layer of a semiconductor device, using the laser marking method according to the embodiment.

FIG. 18 is a micrograph and an automatic recognition image when laser marks are provided on an exposed surface of a metal layer using the laser marking method according to the embodiment.

FIG. 19 is an electron microscope image indicating a portion of laser marks provided on a second metal layer using the laser marking method according to the embodiment, and is a table showing results of measuring, by EDX, an oxygen mass concentration in the second metal layer at the periphery of the laser mark (after left in the air for one month).

FIG. 20 is an electron microscope image indicating a portion of laser marks provided on a second metal layer using the laser marking method according to the embodiment, and is a table showing results of measuring, by EDX, an oxygen mass concentration in the second metal layer at the periphery of the laser mark (after left in the air for six months).

FIG. 21 shows an example of a laser mark provided by conventional method A, and micrographs each indicating an enlarged portion of the laser mark, in the case where the surface roughness of a base portion of a metal layer is low and in the case where the surface roughness of the same is high.

FIG. 22 shows an example of a laser mark provided by the disclosed method, and micrographs each indicating an enlarged portion of the laser mark, in the case where the surface roughness of a base portion of a metal layer is low and in the case where the surface roughness of the same is high.

FIG. 23 is a diagram for describing one marking line by a laser beam and the size of one letter when a laser mark is provided by the laser marking method according to the embodiment.

DESCRIPTION OF EMBODIMENTS

Figure 1:
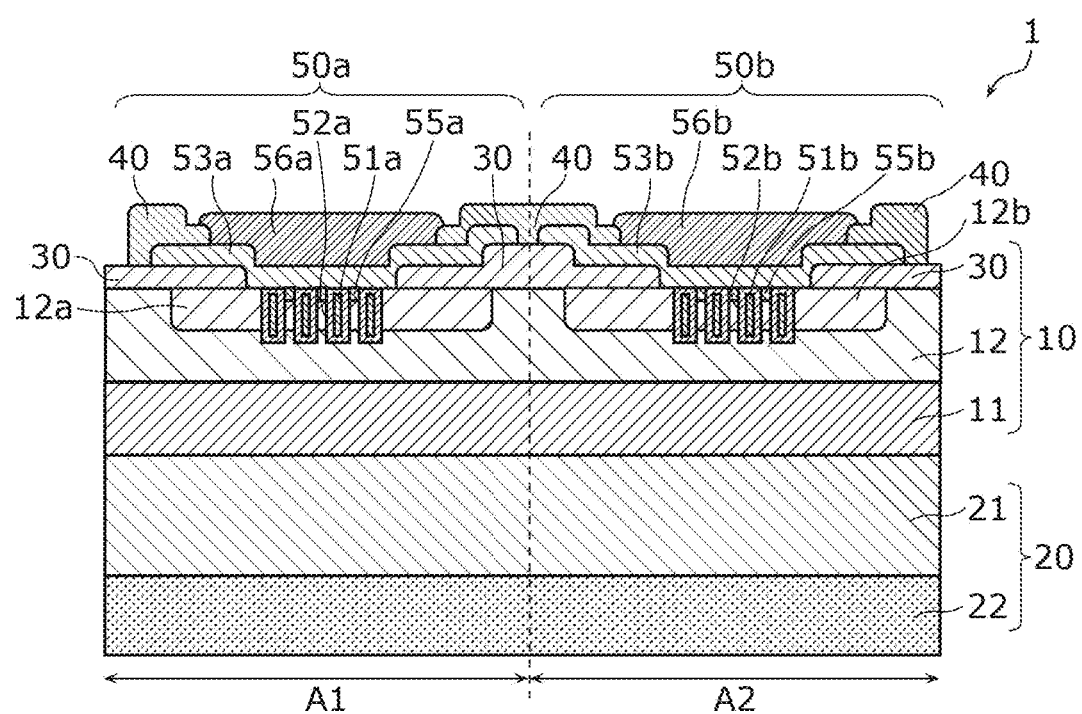
FIG. 1 is a cross-sectional view of a semiconductor device according to an embodiment.

Hereinafter, embodiments of the present disclosure are described with reference to the drawings. It should be noted that each of the embodiments described below shows a specific example of the present disclosure. The numerical values, shapes, materials, constituent elements, the arrangement and connection of the constituent elements, and steps and the sequence of the steps, etc. shown in the following embodiments are mere examples, and are not intended to limit the scope of the present disclosure. Therefore, among the constituent elements in the following embodiments, those not recited in any one of the independent claims that indicate the broadest concepts of the present disclosure are described as optional constituent elements.

It should be noted that the respective figures are schematic diagrams and are not necessarily precise illustrations. Moreover, in the drawings, substantially identical components are assigned the same reference signs, and overlapping description is omitted or simplified. Furthermore, in the Description, the terms "above" and "below" do not necessarily refer to upward (vertically upward) and downward (vertically downward) in the absolute recognition of space.

Embodiment (Semiconductor Device)

Figure 2:
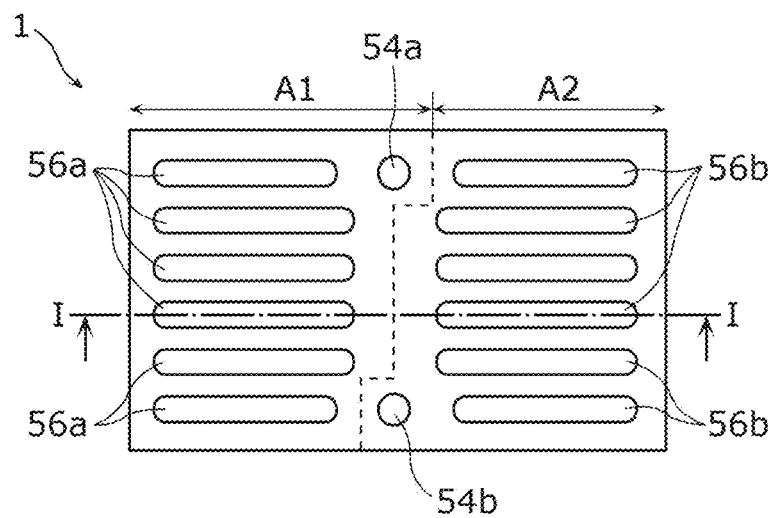
FIG. 2 is a top view of the semiconductor device according to the embodiment.
Figure 3:
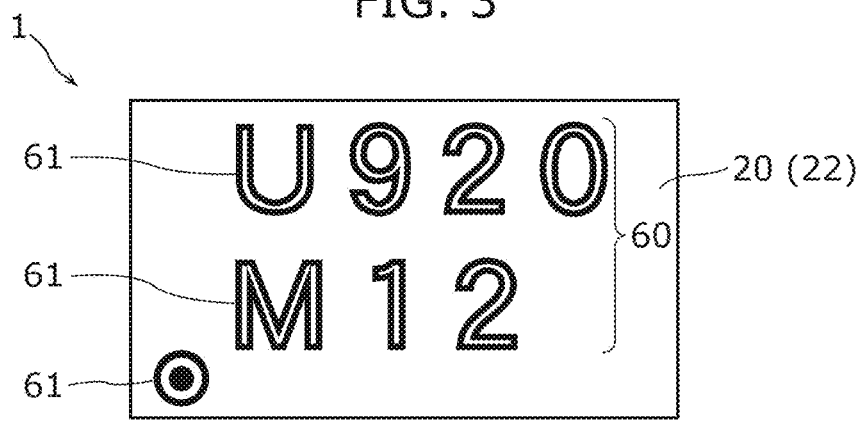
FIG. 3 is a rear view of the semiconductor device according to the embodiment.

First, a configuration of semiconductor device 1 according to an embodiment is described with reference to FIG. 1, FIG. 2, and FIG. 3. FIG. 1 is a cross-sectional view of semiconductor device 1 according to the present embodiment. FIG. 2 is a top view of semiconductor device 1 according to the present embodiment. FIG. 3 is a rear view of semiconductor device 1 according to the present embodiment. It should be noted that FIG. 1 shows a cross section taken along line I-I in FIG. 2.

Semiconductor device 1 shown in FIG. 1 is a facedown mountable, chip-size-package (CSP) type semiconductor device. In the present embodiment, semiconductor device 1 is a dual type semiconductor device in which two vertical metal-oxide semiconductor (MOS) transistors are provided. These two vertical MOS transistors are power transistors, and are what is called trench MOS field-effect transistors (FETs).

As shown in FIG. 1 and FIG. 2, semiconductor device 1 includes semiconductor layer 10, and metal layer 20 that is stacked on semiconductor layer 10.

Semiconductor layer 10 is a semiconductor element that contains a semiconductor material. Specifically, semiconductor layer 10 includes semiconductor substrate 11, and low-concentration impurity layer 12 that is disposed above semiconductor substrate 11.

Semiconductor substrate 11 is, for example, a silicon substrate that includes silicone. Specifically, semiconductor substrate 11 is a silicon substrate that contains impurities of a first conductivity type. It should be noted that semiconductor substrate 11 is not limited to a silicon substrate.

Low-concentration impurity layer 12 is disposed on the top surface of semiconductor substrate 11. Low-concentration impurity layer 12 contains impurities of the first conductivity type that have a concentration lower than a concentration of the impurities of the first conductivity type contained in semiconductor substrate 11. Low-concentration impurity layer 12 is provided by, for example, epitaxial growth.

Oxide film 30 is disposed as an insulating film on semiconductor layer 10. Specifically, oxide film 30 is disposed on low-concentration impurity layer 12. In addition, protective layer 40 that contains a resin material such as polyimide is disposed on oxide film 30.

Metal layer 20 is disposed on semiconductor layer 10. Specifically, metal layer 20 is disposed on semiconductor substrate 11. In the present embodiment, metal layer 20 is a back surface electrode, and is disposed on the bottom surface (back surface) of semiconductor substrate 11.

Metal layer 20 includes a plurality of metal layers. In the present embodiment, metal layer 20 has a two-layered structure of first metal layer 21 and second metal layer 22. Accordingly, first metal layer 21 and second metal layer 22 are disposed on semiconductor substrate 11.

First metal layer 21 is located on a semiconductor substrate 11 side, and second metal layer 22 is located on the side opposite to the semiconductor substrate 11 side. In other words, first metal layer 21 is disposed on the bottom surface of semiconductor substrate 11, and second metal layer 22 is disposed on the bottom surface of first metal layer 21. In the present embodiment, since second metal layer 22 is the outermost surface layer (outermost layer) of metal layer 20, the bottom surface of metal layer 20 is the bottom surface of second metal layer 22.

Moreover, metal layer 20 is exposed to the outside. Specifically, the bottom surface of metal layer 20 is an exposed surface exposed to the outside. In the present embodiment, since second metal layer 22 is the outermost layer of metal layer 20, second metal layer 22 is exposed to the outside. For this reason, the bottom surface of second metal layer 22 is an exposed surface exposed to the outside. It should be noted that the lateral surfaces of first metal layer 21 and second metal layer 22 are also part of exposed surfaces of metal layer 20.

First metal layer 21 is disposed on the bottom surface of semiconductor substrate 11. First metal layer 21 contains a metal material such as silver or copper. First metal layer 21 has a thickness of, for example, at least 30 μm and at most 60 μm. It should be noted that the metal material contained in first metal layer 21 is not limited to silver or copper.

Second metal layer 22 is disposed on first metal layer 21. To put it another way, first metal layer 21 is a foundation layer disposed below second metal layer 22. Second metal layer 22 contains a metal material that has a melting point higher than a melting point of the metal material contained in first metal layer 21. In addition, the metal material contained in second metal layer 22 has a Young's modulus higher than a Young's modulus of the metal material contained in first metal layer 21. Examples of the metal material contained in second metal layer 22 include nickel. Second metal layer 22 has a thickness of, for example, at least 2 μm. In the present embodiment, second metal layer 22 has a thickness of at least 10 μm and at most 35 μm. It should be noted that although second metal layer 22 is thinner than first metal layer 21, the present disclosure is not limited to this example. Additionally, the metal material contained in second metal layer 22 is not limited to nickel.

In the present embodiment, first metal layer 21 and second metal layer 22 are both plating films provided by a plating method. However, first metal layer 21 and second metal layer 22 are not limited to plating films. In this case, first metal layer 21 and second metal layer 22 may be vapor-deposited films provided by a vapor deposition method or sputtering films provided by a sputtering method. Moreover, when second metal layer 22 is a plating film, second metal layer 22 often has a non-smooth exposed surface, compared to a case in which second metal layer 22 is a vapor-deposited film. It should be noted that first metal layer 21 and second metal layer 22 may each contain, for example, a metal material other than the metal material that is a main component. For example, first metal layer 21 and second metal layer 22 may each contain a trace amount of impurities mixed in during the manufacturing process.

As shown in FIG. 1, two transistors of first vertical MOS transistor 50a and second vertical MOS transistor 50b are disposed in semiconductor device 1. As shown in FIG. 2, first vertical MOS transistor 50a and second vertical MOS transistor 50b are disposed in first region A1 and second region A2, respectively. First region A1 and second region A2 are one portion and the other portion that are adjacent to each other and divide semiconductor device 1 into equal halves in a top view of semiconductor device 1.

First body region 12a in first vertical MOS transistor 50a is disposed in first region A1 in low-concentration impurity layer 12. First body region 12a contains impurities of a second conductivity type that is different from the first conductivity type.

Moreover, second body region 12b in second vertical MOS transistor 50b is disposed in second region A2 in low-concentration impurity layer 12. Second body region 12b contains impurities of the second conductivity type. Stated differently, first body region 12a and second body region 12b both contain the impurities of the second conductivity type.

First vertical MOS transistor 50a includes first gate electrode (first gate conductor) 51a, first gate insulating film 52a, and first source electrode 53a.

First gate electrode 51a is disposed in first body region 12a. First gate electrode 51a is electrically connected to first gate pad 54a shown in FIG. 2. In addition, first gate insulating film 52a and first source region 55a that contains impurities of the first conductivity type are further disposed in first body region 12a.

First source electrode 53a is in contact with first body region 12a via an opening provided in oxide film 30. First source electrode 53a contains a metal material that includes at least one of, for example, aluminum, copper, gold, or silver.

First source pad 56a is disposed on first source electrode 53a. First source pad 56a is connected to first source region 55a and first body region 12a via first source electrode 53a. First source pad 56a is exposed from an opening of protective layer 40. As shown in FIG. 2, a plurality of (six in FIG. 2) first source pads 56a are disposed in the present embodiment.

When semiconductor device 1 is mounted on a mounting substrate by facedown mounting, first source pad 56a is bonded to the mounting substrate via a bonding material such as solder. For example, first source pad 56a is bonded to a bonding material such as solder at the time of reflow in the facedown mounting. As an example, first source pad 56*a* contains a metal material including at least one of nickel, titanium, tungsten, copper, or palladium. It should be noted that a plating film such as gold may be disposed on the top surface of first source pad 56*a*. Moreover, solder bumps or solder balls may be connected to the top surface of first source pad 56*a* or the plating film disposed on the top surface. Furthermore, although semiconductor device 1 is mounted by facedown mounting in the present embodiment, semiconductor device 1 may be mounted by faceup mounting. For example, when semiconductor device 1 is used as an on-board component mounted in a circuit board etc., the facedown mounting can be performed in the case where a lower via and first source pad 56*a* etc. are connected in the circuit board; and the faceup mounting can be performed in the case where an upper via and first source pad 56*a* etc. are connected in the circuit board. It should be noted that regardless of the facedown mounting or the faceup mounting, the back surface (rear surface) of semiconductor device 1 is a marking surface on which laser mark 61 described below is provided.

Second vertical MOS transistor 50*b* basically has the same structure as first vertical MOS transistor 50*a*. Specifically, second vertical MOS transistor 50*b* includes second gate electrode (second gate conductor) 51*b*, second gate insulating film 52*b*, and second source element 53*b*.

Second gate electrode 51*b* is disposed in second body region 12*b*. Second gate electrode 51*b* is electrically connected to second gate pad 54*b* shown in FIG. 2. In addition, second gate insulating film 52*b* and second source region 55*b* that contains impurities of the first conductivity type are further disposed in second body region 12*b*.

Second source electrode 53*b* is in contact with second body region 12*b* via an opening provided in oxide film 30. Second source electrode 53*b* contains the same metal material as first source electrode 53*a*.

Second source pad 56*b* is disposed on second source electrode 53*b*. Second source pad 56*b* is connected to second source region 55*b* and second body region 12*b* via second source electrode 53*b*. Second source pad 56*b* is exposed from an opening of protective layer 40. As shown in FIG. 2, a plurality of (six in FIG. 2) second source pads 56*b* are disposed in the present embodiment.

As with first source pad 56*a*, second source pad 56*b* is bonded to the mounting substrate via a bonding material such as solder when semiconductor device 1 is facedown mounted. Second source pad 56*b* contains the same metal material as first source pad 56*a*. It should be noted that a plating film such as gold may be disposed on the top surface of second source pad 56*b*. Moreover, solder bumps or solder balls may be connected to the top surface of second source pad 56*b* or the plating film disposed on the top surface. Moreover, as with the above description, semiconductor device 1 may be mounted by faceup mounting. For example, when semiconductor device 1 is used as an on-board component mounted in a circuit board etc., the facedown mounting can be performed in the case where a lower via and second source pad 56*b* etc. are connected in the circuit board; and the faceup mounting can be performed in the case where an upper via and second source pad 56*b* etc. are connected in the circuit board. In any of these cases, the back surface (rear surface) of semiconductor device 1 is a marking surface.

In first vertical MOS transistor 50*a* and second vertical MOS transistor 50*b* thus configured, a first drain region of first vertical MOS transistor 50*a* is semiconductor substrate 11 and low-concentration impurity layer 12, and a second drain region of second vertical MOS transistor 50*b* is semiconductor substrate 11 and low-concentration impurity layer 12. In other words, a drain region is shared by first vertical MOS transistor 50*a* and second vertical MOS transistor 50*b* provided in one semiconductor device 1, and semiconductor substrate 11 and low-concentration impurity layer 12 in semiconductor device 1 serve as a common drain region of first vertical MOS transistor 50*a* and second vertical MOS transistor 50*b*.

Moreover, when semiconductor device 1 is a dual type semiconductor device including two vertical MOS transistors as in the present embodiment, a bidirectional passing current flows via metal layer 20. For this reason, it is better to make metal layer 20 thicker. Increasing the thickness of metal layer 20 makes it possible to reduce on resistance. Moreover, although it is advisable to make semiconductor substrate 11 thinner and metal layer 20 thicker to further reduce on resistance, this may cause a warpage of semiconductor device 1. In view of this, it is advisable to increase the thickness of second metal layer 22 that is a nickel layer of metal layer 20, to prevent the warpage. It should be noted that second metal layer 22 may have a thickness of at least 2 μm from a standpoint of reducing on resistance and preventing the warpage of semiconductor device 1.

As shown in FIG. 3, code 60 is provided on the back surface (rear surface) of semiconductor device 1. In the present embodiment, code 60 is provided on the bottom surface of metal layer 20 that is the exposed surface of metal layer 20. Specifically, code 60 is provided on the bottom surface of second metal layer 22 that is an exposed surface of second metal layer 22.

Code 60 is, for example, an identification code for identifying individual semiconductor device 1. In the present embodiment, code 60 is provided by combining a plurality of letters constituting a language such as English letters (the English alphabet), numbers such as Arabic numerals or Roman numerals, and various symbols including figures such as a circle and a quadrilateral. Code 60 shown in FIG. 3 is composed of a letter string of one English letter and three numbers that represents "U920", a letter string of one English letter and two numbers that represents "M12", and a circle figure. More specifically, the letter string representing "U920" and the letter string representing "M12" are disposed in two rows, and the circle figure is disposed to the lower left of the letter string indicating "M12". It should be noted that the circle figure indicates a circular mark (pin mark) showing the location of the first pin described in product specification.

Every single letter, number, or the like included in code 60 includes laser mark 61. In other words, one laser mark 61 corresponds to one letter, one number, one figure, or the like, and code 60 is composed of one or more laser marks 61. Accordingly, at least one laser mark 61 is provided on the exposed surface of metal layer 20 (the exposed surface of second metal layer 22 in the present embodiment).

It should be noted that laser mark 61 is not limited to a letter, a number, or a figure, and may be another symbol such as a pattern, a design, or a sign. In the Description, symbols such as letters, numbers, figures, patterns, designs, and signs are collectively referred to as characters. As stated above, laser mark 61 is a character-shaped structural object including a character.

Laser mark 61 is an example of a mark indicating one character included in code 60. In the present embodiment, laser mark 61 is a mark indicating a character provided by a laser beam. Laser mark 61 is provided on the exposed surface of metal layer 20 by a laser beam. Specifically, laser mark 61 is provided on the exposed surface of metal layer 20 by radiating the laser beam to the exposed surface of metal layer 20 that is a target (a marking target) on which laser mark 61 is provided.

Figure 4:
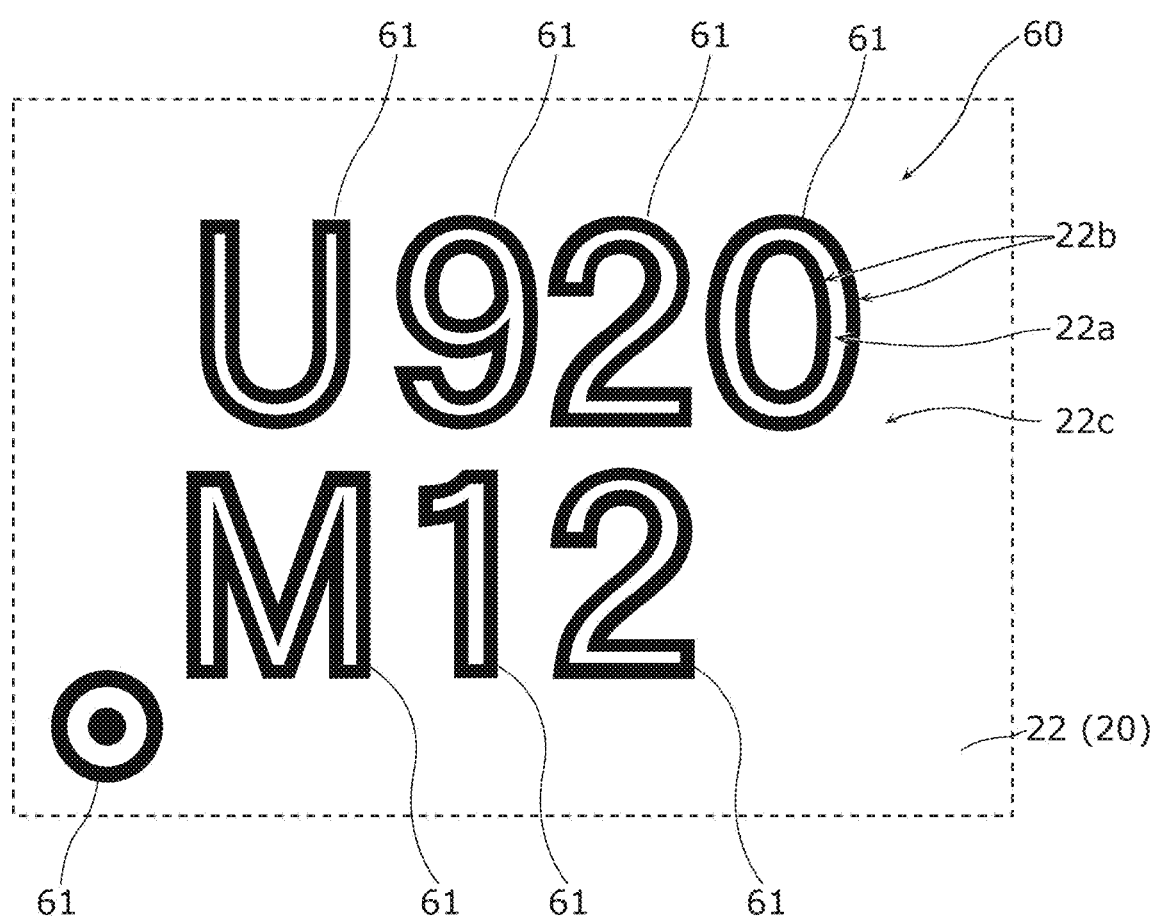
FIG. 4 is an enlarged view of a portion with a code on a metal layer of the semiconductor device according to the embodiment.
Figure 5:
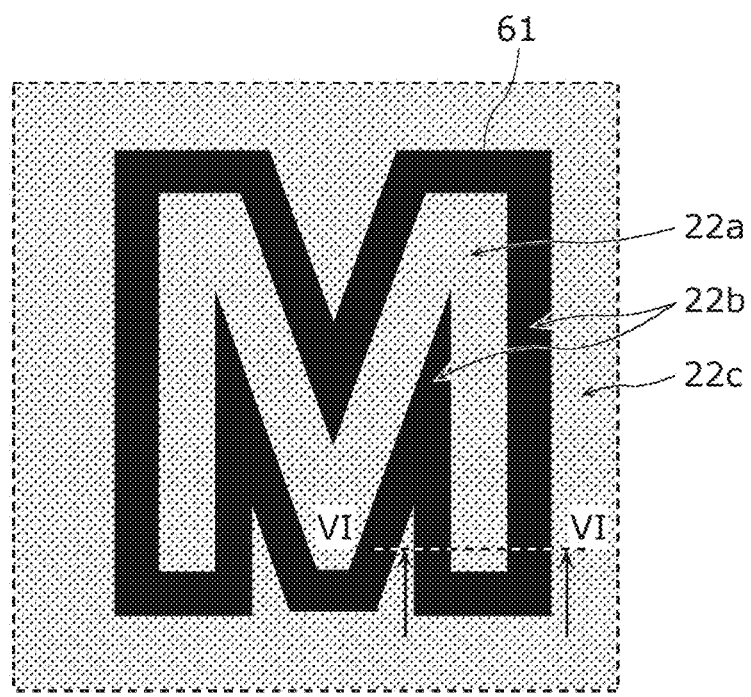
FIG. 5 is an enlarged view of one of laser marks constituting the code shown in FIG. 4.
Figure 6:
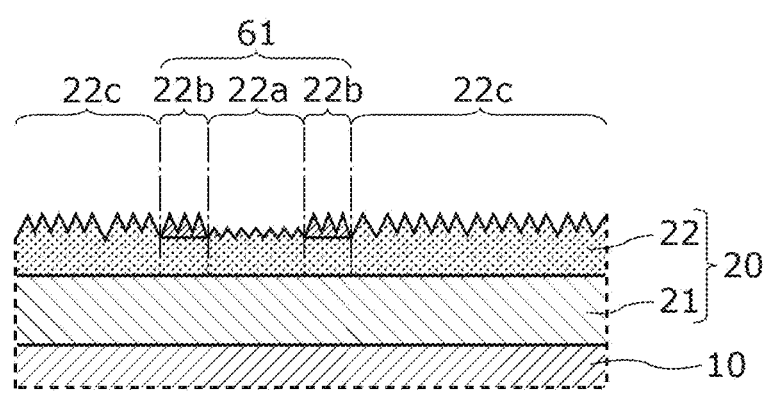
FIG. 6 is a cross-sectional view taken along line VI-VI in FIG. 5.

Hereinafter, details of laser mark 61 are described with reference to FIG. 4 to FIG. 6. FIG. 4 is an enlarged view of a portion with code 60 in metal layer 20 of semiconductor device 1. FIG. 5 is an enlarged view of laser mark 61 indicating "M" in code 60 shown in FIG. 4. FIG. 6 is a cross-sectional view of semiconductor device 1, taken along line VI-VI shown in FIG. 5.

Laser mark 61 is provided by processing a portion of the exposed surface of metal layer 20 by a laser beam. In the present embodiment, laser mark 61 is obtained by processing a portion of the exposed surface of second metal layer 22. When laser mark 61 of a prescribed character is provided on the exposed surface of second metal layer 22, it is possible to provide laser mark 61 of the prescribed character on the exposed surface of second metal layer 22 by moving the laser beam radiated to second metal layer 22 to draw the prescribed character.

As shown in FIG. 4 to FIG. 6, laser mark 61 includes central portion 22a defining an inner portion of laser mark 61, and outline portion 22b defining the outline of laser mark 61. Central portion 22a and outline portion 22b constitute a letter portion recognized as a character indicated by laser mark 61 on second metal layer 22. Central portion 22a and outline portion 22b constituting laser mark 61 are each a portion obtained by processing second metal layer 22 by a laser beam. Central portion 22a and outline portion 22b are provided in a linear shape such as at least one of a straight line or a curved line to extend in a moving direction of the laser beam when laser mark 61 is provided. Although details are described later, central portion 22a corresponds to a region itself where the portion is irradiated with the laser beam (a laser irradiation spot), and outline portion 22b corresponds to a peripheral region of the portion irradiated with the laser beam (the laser irradiation spot).

As shown in FIG. 5 and FIG. 6, central portion 22a is located inward of outline portion 22b in a plan view and a cross-sectional view of second metal layer 22. Specifically, central portion 22a is located inward of outline portion 22b in a direction orthogonal to the moving direction of the laser beam.

Moreover, outline portion 22b is located on the both sides of central portion 22a in the plan view and cross-sectional view of second metal layer 22. Specifically, outline portion 22b is located outward of central portion 22a in a direction orthogonal to the moving direction of the laser beam. Outline portion 22b is provided around the edge on both sides of central portion 22a. Accordingly, central portion 22a is sandwiched between a pair of outline portions 22b.

It should be noted that a portion of the exposed surface of second metal layer 22 on which laser mark 61 is not provided is base portion 22c of second metal layer 22. In other words, base portion 22c is a portion of the exposed surface of second metal layer 22 that is not processed by the laser beam. Base portion 22c is a background portion of the exposed surface of second metal layer 22 on which laser marking is not performed.

Outline portion 22b has a color different from at least one of a color of central portion 22a or a color of base portion 22c in a plan view of the exposed surface of second metal layer 22. In the present embodiment, outline portion 22b has a color different from both a color of central portion 22a and a color of base portion 22c.

Central portion 22a and base portion 22c may have the same color or different colors. In the present embodiment, although central portion 22a has the color different from the color of base portion 22c, the color of central portion 22a is more similar to the color of base portion 22c than to the color of outline portion 22b. Specifically, the color of central portion 22a and the color of base portion 22c are comparable colors or similar colors. To put it another way, with regard to laser mark 61 in the present embodiment, central portion 22a and base portion 22c have the comparable colors or the similar colors, and outline portion 22b has the color different from the color of central portion 22a and the color of base portion 22c.

It should be noted that a surface composition of second metal layer 22 in outline portion 22b is different from a surface composition of second metal layer 22 in base portion 22c and/or a surface composition of second metal layer 22 in central portion 22a. In the present embodiment, a surface composition of second metal layer 22 in outline portion 22b is different from both a surface composition of second metal layer 22 in base portion 22c and a surface composition of second metal layer 22 in central portion 22a. It should be noted that a surface composition of second metal layer 22 refers to element types and an element ratio in the surface of second metal layer 22. Metal and oxygen constituting second metal layer 22 are main elements in second metal layer 22.

When metal included in second metal layer 22 is nickel (Ni), nickel is blackened by oxidation resulting from laser beam irradiation. For this reason, with variation of the composition due to the oxidation of second metal layer 22 by the laser beam irradiation, outline portion 22b is blackened, compared to base portion 22c and central portion 22a. In other words, a portion of second metal layer 22 is blackened (oxidized) and becomes outline portion 22b. It should be noted that since a color change of a metal due to oxidation is determined by a degree of oxidation (oxygen content), the relation between the degrees of color change satisfies outline portion»base portion≈central portion.

As stated above, since the composition varies due to the oxidation of second metal layer 22 by the laser beam irradiation when laser mark 61 is provided on second metal layer 22, an oxygen content in second metal layer 22 partially changes. Specifically, a surface oxygen content of second metal layer 22 in outline portion 22b is higher than a surface oxygen content of second metal layer 22 in central portion 22a. In addition, the surface oxygen content of second metal layer 22 in outline portion 22b is higher than a surface oxygen content of second metal layer 22 in base portion 22c. In the present embodiment, a surface oxygen content of second metal layer 22 is highest in outline portion 22b.

Specifically, when a surface oxygen content of second metal layer 22 in outline portion 22b is denoted by A, a surface oxygen content of second metal layer 22 in base portion 22c is denoted by B, and a surface oxygen content of second metal layer 22 in central portion 22a is denoted by C, A>B≥C is satisfied. An oxygen content can be represented by, for example, an oxygen mass concentration [%].

Such a change in oxygen content in second metal layer 22 is caused by the oxidation effect of second metal layer 22. In this case, the oxidation of second metal layer 22 causes a light absorption coefficient of second metal layer 22 to change, and as a result, the color of second metal layer 22 partially appears different depending on the degree of oxidation.

It should be noted that although the metal included in second metal layer 22 is nickel in the present embodiment, the present disclosure is not limited to this example. For example, metal included in second metal layer 22 may be magnesium, aluminum, chrome, copper, or the like. When metal included in second metal layer 22 is magnesium or aluminum, outline portion 22b provided by oxidation is white. Additionally, when metal included in second metal layer 22 is chrome, the color of second metal layer 22 changes depending on an oxidation state of chrome.

(Laser Marking Method)

Next, a laser marking method for providing laser mark 61 on an exposed surface of metal layer 20 is described with reference to FIG. 7. FIG. 7 is a diagram for describing the laser marking method according to the embodiment. It should be noted that in the present embodiment, laser mark 61 is provided on the exposed surface of second metal layer 22 in metal layer 20.

In the laser marking method according to the present embodiment, laser mark 61 of a prescribed character is provided on an exposed surface of second metal layer 22 by pulse radiating a laser beam to the exposed surface of second metal layer 22 under prescribed conditions, using a pulse laser.

(a) in FIG. 7 shows a state of the first shot of pulsed laser beam irradiation to the exposed surface of second metal layer 22. (b) in FIG. 7 shows a situation when the laser beam is pulse radiated and moved. As shown in (b) in FIG. 7, the laser beam is repeatedly pulse radiated to the exposed surface of second metal layer 22. As a result, it is possible to provide laser mark 61 including central portion 22a and outline portion 22b on the exposed surface of second metal layer 22.

In the present embodiment, a laser beam is pulse radiated to the exposed surface of second metal layer 22 under prescribed conditions to cause a first action and a second action in parallel on the exposed surface of second metal layer 22.

The first action is an action that performs chemical processing on the exposed surface of second metal layer 22 in a region irradiated with the laser beam (a circular laser irradiation spot having radius r) and a peripheral region of the region, without performing physical processing thereon. In the present embodiment, the chemical processing performed on second metal layer 22 is oxidation. In other words, a circular region having radius r that is irradiated with the laser beam and an annular region from radius r to +Δr that is a peripheral region of the circular region are oxidized by radiating the laser beam to the exposed surface of second metal layer 22. Consequently, the color of second metal layer 22 in the region irradiated with the laser beam and the peripheral region changes due to the region irradiated with the laser beam and the peripheral region becoming an oxidized region. For example, when second metal layer 22 includes nickel, second metal layer 22 is oxidized and blackened by being irradiated with a laser beam. The region irradiated with the laser beam and the peripheral region correspond to central portion 22a and outline portion 22b of laser mark 61, respectively. To put it another way, the first action causes a letter portion of laser mark 61 composed of central portion 22a and outline portion 22b to be an oxidized region and have a color different from a color of base portion 22c.

It should be noted that since base portion 22c in the exposed surface of second metal layer 22 is a portion unaffected by the laser beam irradiation, base portion 22c is not oxidized by the laser beam. Base portion 22c, however, can be naturally oxidized.

As stated above, the first action is an action that increases the degree of oxidation of central portion 22a and outline portion 22b, compared to base portion 22c in the exposed surface of second metal layer 22.

In contrast, the second action is an action that decreases the degree of oxidation only for a region irradiated with a laser beam that corresponds to central portion 22a. Specifically, the second action is an action that etches, using a laser beam, only the region irradiated with the laser beam included in the oxidized region obtained by oxidizing second metal layer 22 by the first action. In other words, the second action is an action that performs physical processing only on the region irradiated with the laser beam included in the oxidized region of second metal layer 22. The second action etches and removes only the portion irradiated with the laser beam included in the oxidized region of second metal layer 22. An unoxidized layer of second metal layer 22 below the oxidized region is exposed by etching the oxidized region.

As stated above, the second action is an action that decreases the degree of oxidation of central portion 22a, compared to base portion 22c in the exposed surface of second metal layer 22. Specifically, the second action is an action that etches the oxidized region of second metal layer 22.

In the laser marking method according to the present embodiment, laser beam irradiation conditions are controlled to cause the first action and the second action in parallel on the exposed surface of second metal layer 22. As a result, the region irradiated with the laser beam (circular laser irradiation spot having radius r) is etched right after the region becomes the oxidized region, and becomes central portion 22a of laser mark 61. In contrast, the peripheral region (annular region from radius r to +Δr) of the region irradiated with the laser beam remains as the oxidized region without being etched, and becomes outline portion 22b of laser mark 61. To put it another way, central portion 22a is a region provided by the physical processing, and outline portion 22b is a region provided only by the change caused by the chemical processing without substantially performing the physical processing thereon. As described above, by adjusting the laser beam irradiation conditions, it is possible to simultaneously provide central portion 22a and outline portion 22b in parallel by the single laser beam irradiation.

In the laser marking method according to the present embodiment, as shown in (b) in FIG. 7, laser mark 61 of a prescribed character is drawn by moving a pulsed laser beam. In this case, the laser beam pulse irradiation causes circular laser irradiation spots having radius r to be contiguously provided at distance d from each other sequentially. In other words, a plurality of contiguous laser irradiation spots are obtained by overlapping two adjacent laser irradiation spots with each other.

Central portion 22a of laser mark 61 is provided by the second action continuously etching, for each of the laser irradiation spots on the exposed surface of second metal layer 22, an oxidized region created by the first action. As a result, central portion 22a of laser mark 61 provided as the prescribed character is provided in a pleated shape. To put it another way, pleated traces remain in central portion 22a. It should be noted that it is possible to calculate distance d between two adjacent laser irradiation spots by measuring a distance between pleats on a straight line (center line)

connecting the centers of the two laser irradiation spots multiple times, and calculating an average value of the distances.

In contrast, outline portion 22b of laser mark 61 is provided by overlapping an oxidized region created by the first action multiple times in the peripheral region of the laser irradiation spot on the exposed surface of second metal layer 22.

Central portion 22a and outline portion 22b thus provided are described in detail with reference to FIG. 8. FIG. 8 is a diagram illustrating the first action and the second action for each laser irradiation spot (each shot) of a laser beam that is pulse radiated. (a) in FIG. 8 shows four continuous laser beams, and (b) in FIG. 8 shows two continuous laser beams. It should be noted that, in (a) in FIG. 8, a black circle indicates a region of one laser irradiation spot oxidized by a laser beam on a straight line (center line) connecting the centers of contiguous laser irradiation spots, and a white circle indicates a region of the one laser irradiation spot etched by the laser beam on the center line. Moreover, in (b) in FIG. 8, "d" denotes a distance between two adjacent laser irradiation spots, "r" denotes the radius of an irradiation spot of a laser beam (a laser irradiation spot) in a region irradiated with the laser beam, "Δr" denotes the range of a peripheral region of the region irradiated with the laser beam, and "θ" denotes an angle formed by (i) a straight line connecting the center of the laser irradiation spot and an intersection point between the two adjacent laser irradiation spots and (ii) a center line connecting the centers of the two adjacent laser irradiation spots.

As shown in (a) and (b) in FIG. 8, with regard to the exposed surface of second metal layer 22 corresponding to central portion 22a, after a region of the exposed surface is etched by physical processing, although the etched region is re-oxidized due to subsequent radiating of the range of r+Δr by the next laser irradiation spot, the re-oxidized region is less oxidized than outline portion 22b. For this reason, central portion 22a achieves a high luminance compared to outline portion 22b. In addition, even when central portion 22a is re-oxidized, the re-oxidized region is etched by a laser beam.

In contrast, with regard to the exposed surface of second metal layer 22 corresponding to outline portion 22b, since an annular range from radius r to +Δr has a low irradiation intensity due to distance from the center of the laser irradiation spot, only oxidation is caused by chemical processing (specifically, thermal action). Accordingly, regions oxidized for respective laser irradiation spots are sequentially repeated while overlapping each other on the exposed surface of second metal layer 22 corresponding to outline portion 22b. As a result, when second metal layer 22 includes nickel, blackness of outline portion 22b increases as the regions increasingly overlap each other. Since this causes the color of outline portion 22b to become dark, it is possible to increase the visibility of laser mark 61.

It should be noted that since central portion 22a is provided by thinly etching the exposed surface of second metal layer 22 in the range of radius r by a laser beam, a naturally oxidized portion of the surface of second metal layer 22 is removed by the laser beam. For this reason, the degree of oxidation of central portion 22a temporarily becomes lower than the degree of oxidation of outline portion 22b. Moreover, since, as will be described later, the layer thickness of the oxidized region in second metal layer 22 is an ultrathin thickness that is less than or equal to a depth of approximately 100 nm from the exposed surface of second metal layer 22, the oxidized region is easily removed in second metal layer 22 by the laser beam. Accordingly, although the degree of oxidation in second metal layer 22 temporarily satisfies the degree of oxidation of outline portion 22b»the degree of oxidation of base portion 22c (natural oxidation)≥the degree of oxidation of central portion 22a immediately after laser mark 61 is provided, the degree of oxidation in second metal layer 22 eventually satisfies the degree of oxidation of outline portion 22b»the degree of oxidation of base portion 22c (natural oxidation) ≈the degree of oxidation of central portion 22a (natural oxidation) after a lapse of a long time.

As stated above, in the laser marking method according to the present embodiment, central portion 22a and outline portion 22b of laser mark 61 are provided by sequentially overlapping the laser irradiation spots in the moving direction of the laser beam.

Here, to ensure the visibility of laser mark 61, central portion 22a may be caused to have a certain width. For this purpose, the width of central portion 22a (the circular laser irradiation spot having radius r) included in the circular region having radius r+Δr may increase as much as possible, and at the same time outline portion 22b that becomes increasingly blackened due to a series of oxidation action may be disposed as close to an outer side as possible. In other words, the width (2r) of central portion 22a may be greater than the width (Δr) of outline portion 22b.

Accordingly, in the annular region from radius r to +Δr, the lowest point of an overlapping portion at which laser irradiation spots are adjacent to each other (i.e., an intersection point between two adjacent laser irradiation spots) may be brought closer to an upper portion or a lower portion with a certain distance from the center line (refer to (b) in FIG. 8). In this case, since excessive distance d between the two adjacent laser irradiation spots causes the lowest point to be close to the center line, distance d may be decreased to some extent. It is possible to control distance d by setting a moving speed [mm/sec] of a laser beam and a pulse frequency [kHz] appropriately. It should be noted that it is possible to control radius r of one laser irradiation spot and a peripheral region (a region from radius r to +Δr) of the one laser irradiation spot by adjusting conditions such as a laser beam irradiation intensity and a laser beam focal length.

Moreover, the intersection point between the two adjacent laser irradiation spots is located at d/2. Accordingly, as shown in (b) in FIG. 8, when an angle formed by (i) a straight line connecting the center of the circular laser irradiation spot having radius r and the intersection point between the outer edges of the two adjacent laser irradiation spots and (ii) the center line connecting the centers of the two adjacent laser irradiation spots is denoted by θ, radius r, distance d, and angle θ satisfy the following relation.

$$d = 2r \cdot \cos \theta$$

Here, angle θ may satisfy $66° \leq \theta \leq 87°$. To put it another way, the lower limit of angle θ (i.e., the upper limit of distance d) may be 66°, and the upper limit of angle θ (i.e., the lower limit of distance d) may be 87°.

When $\theta < 66°$, since outline portion 22b is brought close to the center line by 10% of radius r of the laser irradiation spot at minimum, central portion 22a decreases in width, and the difference between outline portion 22b and central portion 22a becomes blurred, which may reduce the visibility of laser mark 61.

In contrast, when $\theta > 87°$, although the difference between outline portion 22b and central point 22a does not become blurred, either the moving speed of the laser beam is significantly decreased or the pulse frequency of the laser beam need be excessively increased. Significantly decreasing the moving speed increases the time it takes to provide laser mark 61. Moreover, since excessively increasing the frequency causes the laser beam to be underpowered, second metal layer 22 becomes less likely to be oxidized with one laser irradiation spot, and blackening of outline portion 22b is reduced (i.e., blackness does not increase), which may end up reducing the visibility of laser mark 61.

In the present embodiment, angle θ is set to approximately 81°. When θ=81°, it is possible to keep the reduction in width of central portion 22a within 2% of radius r above and below central portion 22a. Accordingly, it is possible to easily achieve the visibility of laser mark 61 by keeping the width of central portion 22a while preventing the time it takes to provide laser mark 61 from lengthening.

FIG. 9 shows laser mark 61 actually provided on metal layer 20 of semiconductor device 1, using the laser marking method according to the present embodiment. A marking target of a laser beam is the exposed surface of second metal layer 22 in metal layer 20 having a two-layered structure of first metal layer 21 including silver and second metal layer 22 including nickel. Radius r of a laser irradiation spot of the laser beam is 10 μm, distance d between two adjacent laser irradiation spots is 3 μm, and the width (Δr) of an oxidized region (outline portion 22b) is 15 μm. It should be noted that although the widths (Δr) of a pair of outline portions 22b on either side of central portion 22a are mutually the same, the widths may be different from each other.

As shown by an exterior photograph in FIG. 9, it is clear that laser mark 61 including central portion 22a and outline portion 22b is provided.

Figure 10:
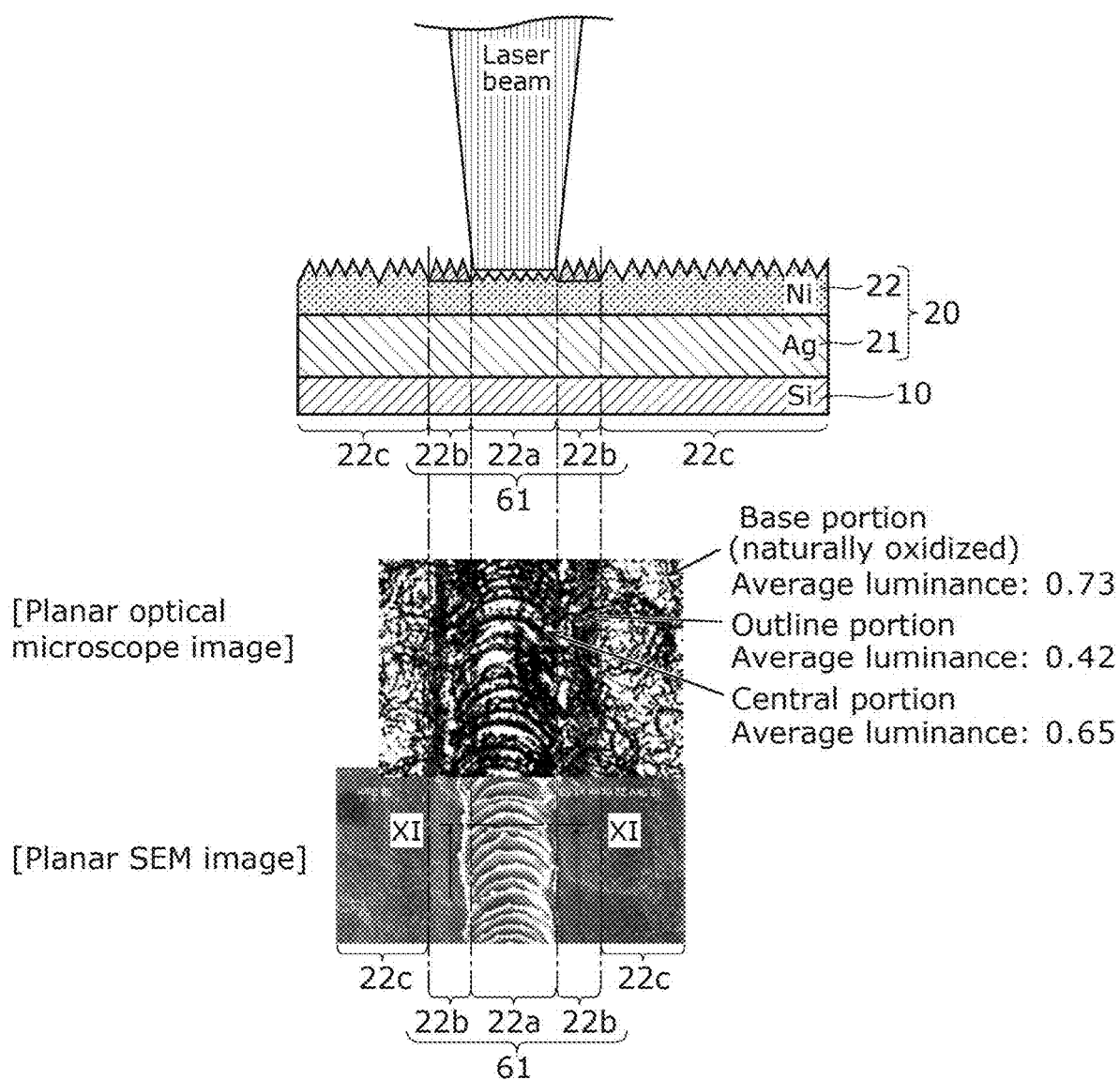
FIG. 10 is a schematic cross-sectional view of an enlarged portion of the laser mark in FIG. 9, and a plan view of the portion.

FIG. 10 is a schematic cross-sectional view of an enlarged portion of laser mark 61 in FIG. 9, and a plan view of the portion. As shown by a planar optical microscope image and a planar SEM image in FIG. 10, it is clear that central portion 22a in which pleated traces remain and outline portion 22b are distinctly provided in laser mark 61. Specifically, it is possible to identify, as outline portion 22b, an oxidized region having a high degree of oxidation from the planar optical microscope image. However, this does not mean that only outline portion 22b is oxidized. Moreover, it is possible to identify, from the planar SEM image, that although an oxidized region is indistinct, central portion 22a is provided in a pleated shape. It should be noted that a planar optical microscope image may be used to measure the radius (r) of a laser irradiation spot and an oxidized region (Δr) of outline portion 22b. Additionally, a planar SEM image may be used to measure a distance (d) between two adjacent laser irradiation spots. With regard to a border between central portion 22a and outline portion 22b, assuming that central portion 22a is a region including pleated spaces, it is possible to consider that a portion at which the pleated spaces become zero and pleated shapes connect with each other is outline portion 22b.

Figure 11:
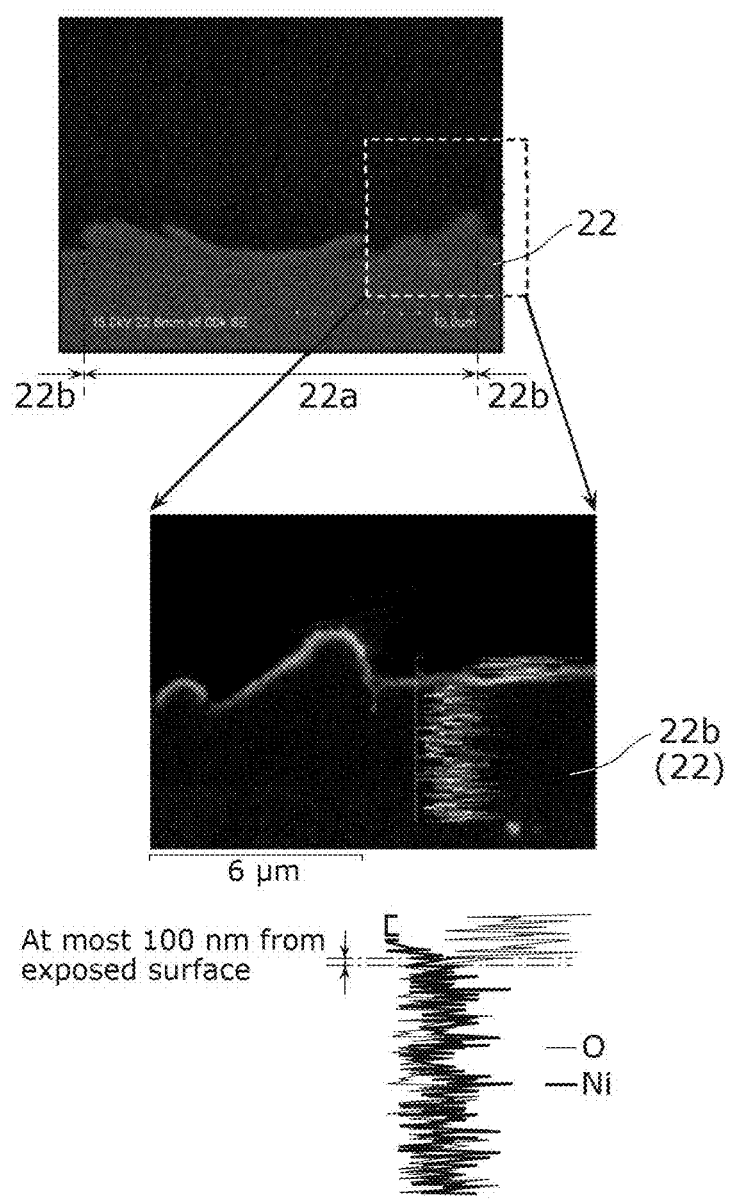
FIG. 11 is a cross-sectional SEM image taken along line XI-XI in FIG. 10.

FIG. 11 is a cross-sectional SEM image taken along line XI-XI in FIG. 10. In addition, FIG. 11 shows results of measuring, by EDX, an oxygen (O) concentration profile and a nickel (Ni) concentration profile of second metal layer 22 including nickel.

As shown by the concentration profiles in FIG. 11, it is clear that an oxidized layer is provided in a region at a depth of 100 nm from the outermost surface of second metal layer 22. In other words, outline portion 22b that is the oxidized region has a thickness of at most 100 μm.

Next, the laser marking method (hereinafter also referred to as "disclosed method") according to the present embodiment is described by comparison with two conventional laser marking methods, conventional method A and conventional method B.

Figure 12:
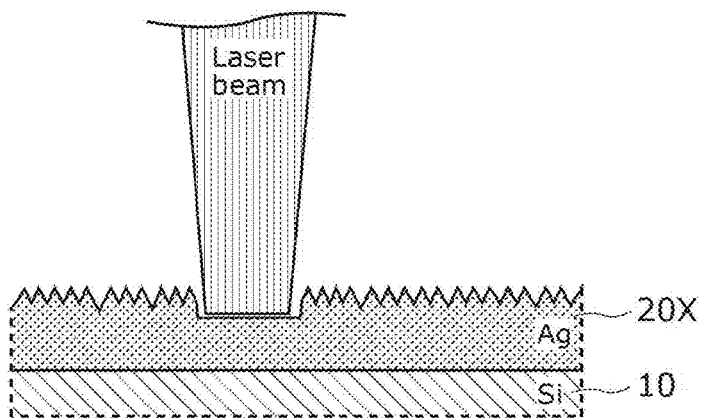
FIG. 12 is a diagram for describing conventional method A.

FIG. 12 is a diagram for describing conventional method A. In FIG. 12, laser marks are provided on an exposed surface of metal layer 20X including silver in a semiconductor device.

As shown in FIG. 12, in conventional method A, a surface layer of metal layer 20X including silver is partially etched by pulse radiating a laser beam to metal layer 20X in the semiconductor device. A user recognizes laser marks provided by conventional method A by the contrast of irregularities between portions (letter portions) etched by being irradiated with a laser beam and portions unetched by not being irradiated with the laser beam.

Figure 13:
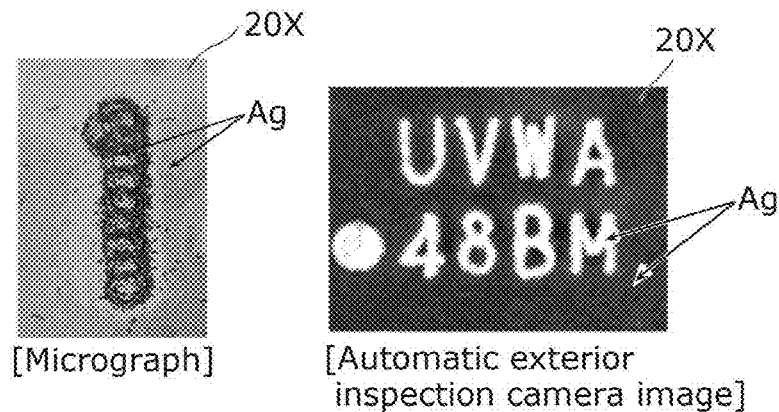
FIG. 13 is a micrograph and an automatic recognition image when laser marks are provided on an exposed surface of a metal layer using conventional method A.

FIG. 13 shows a micrograph and an automatic exterior inspection camera image when laser marks are actually provided on the exposed surface of metal layer 20X including silver, using conventional method A. As shown in FIG. 13, it is possible to recognize the laser marks provided by conventional method A.

Here, it is assumed that metal layer 20X including silver has a thickness of 3 μm, laser power of a laser beam is 22%, a frequency of the laser beam is 40 kHz, a moving speed of the laser beam is 400 mm/sec, and distance d between two adjacent laser irradiation spots is 10 μm. In this case, when a value of laser power [%]/frequency [kHz] is used as a standard indicating the magnitude of energy per laser irradiation spot, the value is small and 0.55. It should be noted that laser power refers to a ratio when the maximum output is 100%.

Figure 14:
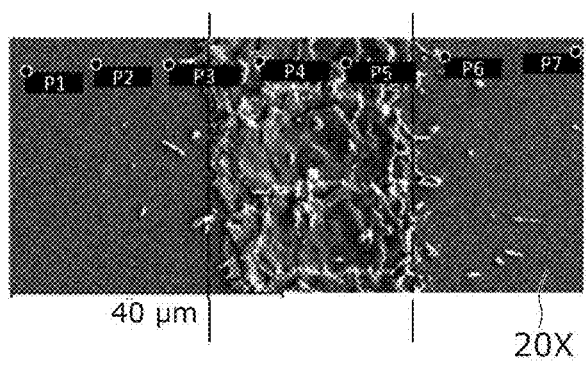
FIG. 14 is an electron microscope image indicating a portion of the laser marks provided on the metal layer by conventional method A, and is a table showing results of measuring, by EDX, an oxygen mass concentration in the metal layer at the periphery of the laser mark.

FIG. 14 shows an electron microscope image indicating a portion of the laser marks provided on metal layer 20X by conventional method A, and results of measuring, by EDX, an oxygen mass concentration in metal layer 20X at the periphery of the laser mark. As shown by the results of EDX in FIG. 14, in conventional method A, an oxidized region is not provided on the exposed surface of metal layer 20X. To put it another way, an oxygen content does not change in a laser processed portion and a base portion in metal layer 20X. Moreover, even when the exposed surface of metal layer 20X is naturally oxidized after laser processing, the entire exposed surface of metal layer 20X is merely naturally oxidized in a uniform manner, and a difference in color is not caused. In other words, in conventional method A, a high oxygen concentration region (color change region) equivalent to outline portion 22b provided by the disclosed method is not present.

In such conventional method A, when metal layer 20X that is a marking target on which laser marks are provided contains a metal material having a relatively low melting point such as silver, it is possible to provide irregularities by etching the surface layer of metal layer 20X by a laser beam, regardless of the thickness of metal layer 20X.

However, when metal layer 20X, the marking target, contains a metal material having a high melting point such as nickel, it is difficult to perform physical processing on metal layer 20X due to a laser beam not having enough power. In other words, metal layer 20X is difficult to etch by the laser beam. Even if it is possible to perform physical processing on metal layer 20X containing a metal material having a high melting point, the irregularities of the exposed surface of metal layer 20X resulting from the physical processing may blend in with the surface roughness of metal layer 20X. To put it another way, even when the irregularities are provided on the exposed surface of metal layer 20X, a weak contrast of the irregularities makes it difficult to see a laser mark and recognize the irregularities as a laser mark of a prescribed character. As described above, conventional method A makes it difficult to provide a recognizable laser mark.

Figure 15:
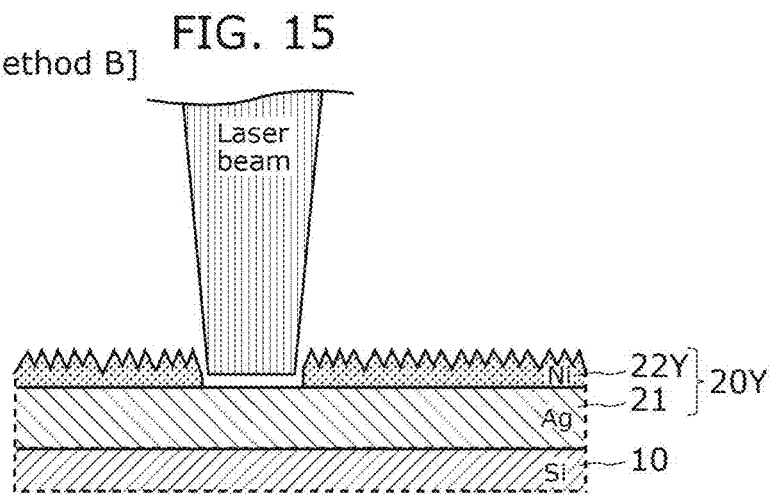
FIG. 15 is a diagram for describing conventional method B.

FIG. 15 is a diagram for describing conventional method B. In FIG. 15, laser marks are provided by pulse radiating a laser beam to an exposed surface of metal layer 20Y having a two-layered structure of first metal layer 21 including silver and second metal layer 22Y including nickel. Specifically, laser marks are provided on an exposed surface of second metal layer 22Y including nickel.

As shown in FIG. 15, even when second metal layer 22Y includes nickel having a high melting point, as long as second metal layer 22Y that is the outermost surface layer is thin (for example, a thickness less than 0.5 μm), it is possible to expose first metal layer 21 that is a foundation layer provided below second metal layer 22Y, by etching second metal layer 22Y with a laser beam. In this manner, since second metal layer 22Y and first metal layer 21 have different surface reflectance, laser marks are recognized by the contrast.

Figure 16:
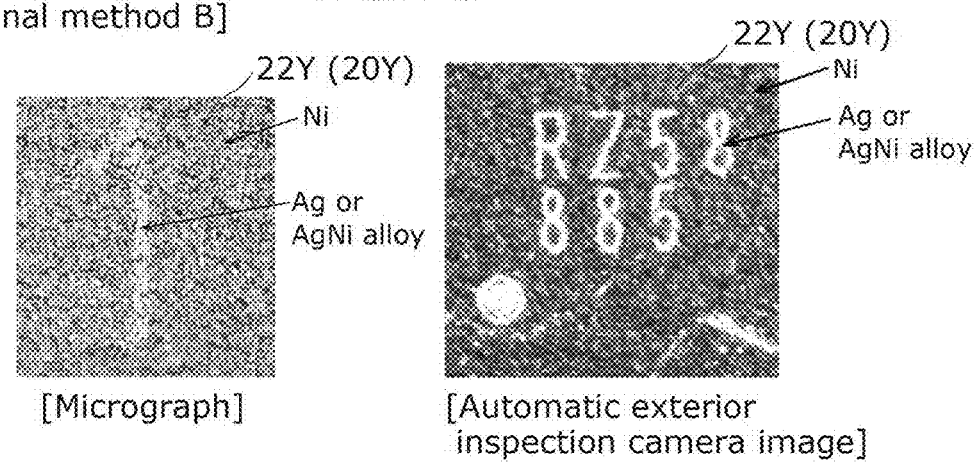
FIG. 16 is a micrograph and an automatic recognition image when laser marks are provided on an exposed surface of a metal layer using conventional method B.

FIG. 16 shows a micrograph and an automatic exterior inspection camera image when laser marks are actually provided on the exposed surface of metal layer 20Y, using conventional method B. As shown in FIG. 16, it is possible to recognize the laser marks provided by conventional method B. It should be noted that letter portions of the laser marks obtained by etching second metal layer 22Y are the surface of first metal layer 21 including silver or the surface of an alloy layer including silver and nickel.

Here, it is assumed that first metal layer 21 including silver has a thickness of 10 μm, second metal layer 22Y including nickel has a thickness of 0.4 μm, laser power of a laser beam is 45%, a frequency of the laser beam is 100 kHz, a moving speed of the laser beam is 600 mm/sec, and distance d between two adjacent laser irradiation spots is 6 μm. In this case, when a value of laser power [%]/frequency [kHz] is used as a standard indicating the magnitude of energy per laser irradiation spot in the same manner as conventional method A, the value is small and 0.45.

Figure 17:
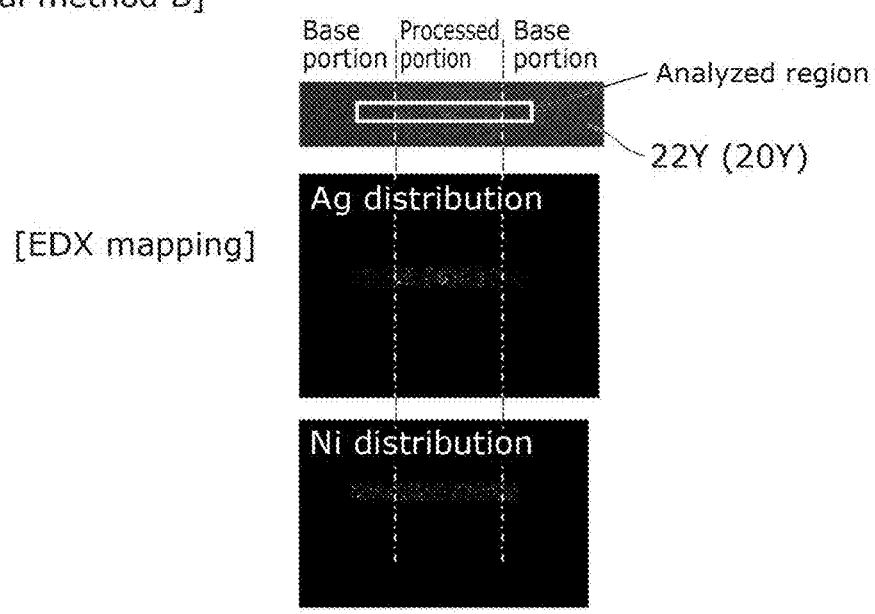
FIG. 17 is an electron microscope image indicating a portion of the laser marks provided on the metal layer by conventional method B, and is a diagram illustrating EDX mapping of the metal layer at the periphery of the laser mark.

FIG. 17 shows an electron microscope image indicating a portion of the laser marks provided on metal layer 20Y by conventional method B, and EDX mapping of silver and nickel in metal layer 20Y at the periphery of the laser mark (periphery of a processed portion). As shown by the EDX mapping of silver, a lot of Ag is detected in the laser processed portion. This is considered to be due to the fact that silver itself, the main component of first metal layer 21, is exposed as a result of first metal layer 21, the foundation layer of second metal layer 22Y, being exposed, or the fact that silver included in first metal layer 21 is alloyed. Moreover, as shown by the EDX mapping of nickel, nickel is detected in the entire surface of second metal layer 22Y.

In such conventional method B, even when second metal layer 22Y that is a marking target contains a metal material having a high melting point, as long as second metal layer 22Y is thin, it is possible to expose first metal layer 21 provided below second metal layer 22Y, by partially removing second metal layer 22Y with a laser beam.

However, when second metal layer 22Y is thick, it may be impossible to etch second metal layer 22Y until first metal layer 21 is exposed, even by radiating a laser beam thereto, and it may be impossible to provide recognizable laser marks on metal layer 20Y. For example, in the case where second metal layer 22Y includes nickel, when second metal layer 22Y has a thickness of at least 2 μm, it becomes impossible for laser beam irradiation to expose first metal layer 21, the foundation layer.

In contrast, in the laser marking method (the disclosed method) according to the present embodiment, even when it is not possible to expose first metal layer 21, the foundation layer, because second metal layer 22, the laser marking target, is thick, and it is difficult to etch second metal layer 22 with a laser beam because second metal layer 22 contains a metal material having a high melting point, as stated above, it is possible to provide recognizable laser marks because the first action and the second action are caused in parallel on the exposed surface of second metal layer 22.

FIG. 18 shows a micrograph and an automatic recognition image when laser marks are actually provided on an exposed surface of metal layer 20 using the disclosed method. Specifically, laser marks are provided on an exposed surface of second metal layer 22. In the disclosed method, since the exposed surface of second metal layer 22 is oxidized by chemical processing referred to as oxidation on the exposed surface of second metal layer 22 to change the color on both sides of central portion 22a, and outline portion 22b is provided on both sides of central portion 22a, as shown in FIG. 18, it is possible to recognize laser marks with high visibility.

Here, it is assumed that first metal layer 21 including silver has a thickness of 40 μm, second metal layer 22 including nickel has a thickness of 34 μm, laser power of a laser beam is 60%, a frequency of the laser beam is 65 kHz, a moving speed of the laser beam is 200 mm/sec, and distance d between two adjacent laser irradiation spots is 3 μm. In addition, a focal position of the laser beam is set to a position at which a laser irradiation spot has radius r of 15 μm. In this case, when a value of laser power [%]/frequency [kHz] is used as a standard indicating the magnitude of energy per laser irradiation spot in the same manner as conventional method A and conventional method B, the value is large and 0.92.

As described above, in the disclosed method, the energy per laser irradiation spot is approximately twice as high compared to conventional method A and conventional method B. Accordingly, it is possible to oxidize the exposed surface of second metal layer 22 including nickel.

Here, the oxidation of second metal layer 22 is caused by heating second metal layer 22 to a high temperature by laser beam irradiation. In the disclosed method, the efficiency of heating to a high temperature per laser beam irradiation increases by reducing the moving speed to at most half of the moving speed in the conventional methods. Moreover, in the disclosed method, with regard to contiguous laser irradiation spots provided by moving the laser beam, a space between two adjacent laser irradiation spots is reduced by decreasing distance d to cause the two adjacent laser irradiation spots to include an overlapping portion to some extent. Since this makes it possible to maintain the heating of the overlapping portion to a high temperature, it is possible to increase the degree of oxidation of second metal layer 22. Specifically, in the disclosed method, distance d between two adjacent laser irradiation spots is 3 μm that is at most half of distance d in conventional method A and conventional method B.

It should be noted that since irregularities may be provided on an exposed surface of a metal layer in conventional method A, and a metal layer may be removed or alloyed in conventional method B, in conventional method A and conventional method B, an overlapping portion of two adjacent laser irradiation spots is not an essential element except that contiguous laser irradiation traces are joined into a character shape. For this reason, in conventional method A and conventional method B, reduction in marking process time may be prioritized, and distance d between the two adjacent laser irradiation spots is set large, unlike in the disclosed method.

FIG. 19 and FIG. 20 each show an electron microscope image indicating a portion of laser marks provided on second metal layer 22 using the disclosed method, and results of measuring, by EDX, an oxygen mass concentration in second metal layer 22 at the periphery of the laser mark. FIG. 19 shows an electron microscope image and an oxygen mass concentration when second metal layer 22 is left in the air for one month, and FIG. 20 shows an electron microscope image and an oxygen mass concentration when second metal layer 22 is left in the air for six months.

As shown by the results of measuring by EDX in FIG. 19, it is clear that central portion 22a of the laser mark is considered to include no oxidized regions or contain a trace amount of oxygen that is too little to detect by EDX. This is considered to be due to the fact that, in central portion 22a, even when second metal layer 22 is oxidized, an oxidized region is removed from central portion 22a by a laser beam. On the other hand, it is clear that oxidized regions remain in outline portion 22b of the laser mark.

It should be noted that, as shown by the results of measuring by EDX in FIG. 20, it is clear that oxygen mass concentrations in central portion 22a, outline portion 22b, and base portion 22c increase by leaving second metal layer 22 in the air for six months (leaving for a long time). This is considered to be due to the fact that central portion 22a, outline portion 22b, and base portion 22c are naturally oxidized by the surfaces of central portion 22a, outline portion 22b, and base portion 22c being continuously exposed in the air. Moreover, it is also clear that leaving second metal layer 22 in the air for a long time causes the degree of oxidation of central point 22a and the degree of oxidation of base portion 22c to be substantially the same. However, in any of the case in which second metal layer 22 is left in the air for one month and the case in which second metal layer 22 is left in the air for six months, the oxygen content of outline portion 22b is highest.

As stated above, in any of the case in which second metal layer 22 is left in the air for one month and the case in which second metal layer 22 is left in the air for six months, the oxygen mass concentration of outline portion 22b is higher than the oxygen mass concentrations of central portion 22a and base portion 22c, and is highest in the exposed surface of second metal layer 22. It should be noted that the respective oxygen mass concentrations of outline portion 22b, base portion 22c, and central portion 22a when second metal layer 22 is left in the air for one month satisfy oxygen mass concentration of outline portion 22b>oxygen mass concentration of base portion 22c>oxygen mass concentration of central portion 22a.

As described above, the oxygen mass concentration of the surface of second metal layer 22 is highest in outline portion 22b. Accordingly, even when central portion 22a and base portion 22c have similar colors, it is possible to distinguish only the color of outline portion 22b of the laser mark as being black.

In the present embodiment, the oxygen mass concentration of outline portion 22b exceeds 3%. In other words, when the laser mark including central portion 22a and outline portion 22b is provided, outline portion 22b is provided to cause the oxygen mass concentration measured by EDX to exceed 3%. Accordingly, even after natural oxidation occurs after a lapse of a long time, it is possible to maintain the difference in color (darkness) of outline portion 22b relative to base portion 22c and central portion 22a. In other words, since the color of outline portion 22b remains dark after the lapse of the long time, it is possible to increase the visibility of the laser mark. It should be noted that the oxygen mass concentration of base portion 22c is approximately 1.7%. It should also be noted that the oxygen mass concentration of outline portion 22b may exceed 3% both immediately after the laser mark is provided and after the lapse of the long time.

Moreover, as shown by the planar SEM images in FIG. 19 and FIG. 20, with regard to the laser mark provided by the disclosed method, it is clear that outline portion 22b is further divided into first region 22b1 and second region 22b2.

First region 22b1 in outline portion 22b is an inner region of outline portion 22b. Specifically, first region 22b1 is in contact with central portion 22a. First region 22b1 is a contiguous irregular region provided outside a laser irradiation spot. Moreover, first region 22b1 includes the irregularities larger than irregularities of base portion 22c. Accordingly, first region 22b1 has the surface roughness greater than surface roughness of base portion 22c.

It should be noted that first region 22b1 includes a portion higher than base portion 22c in the thickness direction of second metal layer 22. Moreover, first region 22b1 is a connected body including peripheral structures of respective laser irradiation spots. Specifically, first region 22b1 is in a shape similar to a milk drop coronet.

Second region 22b2 in outline portion 22b is an outer region of outline portion 22b. Specifically, second region 22b2 is more distant from central portion 22a than first region 22b1 is. In FIG. 19 and FIG. 20, second region 22b2 has a width greater than a width of first region 22b1. Moreover, second region 22b2 includes irregularities smaller than the irregularities of first region 22b1. Accordingly, second region 22b2 has the surface roughness less than the surface roughness of first region 22b1. As an example, second region 22b2 has a surface roughness equal to the surface roughness of base portion 22c.

In a plan view, second region 22b2 has a color different from a color of central portion 22a and/or a color of base portion 22c. Specifically, second region 22b2 differs from central portion 22a and/or base portion 22c in the degree of oxidation. As a result, second region 22b2 differs from central portion 22a and/or base portion 22c in color. It should be noted that the degree of oxidation of base portion 22c may be equal to or different from the degree of oxidation of central portion 22a.

The characteristics of conventional method A, conventional method B, and the disclosed method, and the characteristics of the laser marks provided by conventional method A, conventional method B, and the disclosed method, are summarized to the results shown in Table 1, Table 2, and Table 3 below.

Table 1 shows the characteristics of the laser mark provided by conventional method A. Table 2 shows the characteristics of the laser mark provided by conventional method B. Table 3 shows the characteristics of the laser mark provided by the disclosed method.

It should be noted that the central portion and the outline portion in each of Table 1 for conventional method A and Table 2 for conventional method B show the characteristics at positions corresponding to the central portion and the outline portion of the laser mark provided by the disclosed method, and do not indicate that central portion 22a and outline portion 22b are provided by convention method A and conventional method B.

TABLE 1

[Conventional method A]
(Ag = Less power)

|  |  | Physical processing (roughness) | Chemical processing (oxidation) | Color (Ni) |
|---|---|---|---|---|
| Central portion |  | Forming pleats by continuous surface etching | None | Slightly black determined by processed irregularities |
| Outline portion | First region | Periphery of pulse | None | Black |
|  | Second region | No processing after film forming |  | Substantially constant after film forming |
| Base portion |  |  | None |  |

TABLE 2

[Conventional method B]
(Ni film = Less power)

|  |  | Physical processing (roughness) | Chemical processing (oxidation) | Color (Ni) |
|---|---|---|---|---|
| Central portion |  | Removing exposed layer (or alloying) | None | White of base Ag |
| Outline portion | First region | Substantially none | None | Substantially constant after film forming |
|  | Second region | No processing after film forming |  |  |
| Base portion |  |  | Natural oxidation |  |

TABLE 3

[Disclosed method]
(Ni thick film = More power)

|  |  | Physical processing (roughness) | Chemical processing (oxidation) | Color (Ni) |
|---|---|---|---|---|
| Central portion (22a) |  | Forming pleats by continuous extremely shallow surface etching | Lower than natural oxidation immediately after forming, and similar to natural oxidation after lapse of long time | Slightly white immediately after forming, and substantially same as base portion after lapse of long time |
| Outline portion (22b) | First region (22b1) | Periphery of pulse | Oxygen content higher than that in natural oxidation (oxygen mass of EDX >3%) | Color of oxidized part of base portion Black (Ni) |
|  | Second region (22b2) | No processing after film forming |  |  |
| Base portion (22c) |  |  | Natural oxidation | Substantially constant after film forming |

Moreover, a comparison of conventional method A and the disclosed method shows that the surface roughness of the exposed surface (i.e., the surface roughness of the base portion) of the metal layer on which the laser mark is provided affects the visibility of the laser mark. This point is described with reference to FIG. 21 and FIG. 22. FIG. 21 shows an example of laser mark 61 provided by conventional method A, and micrographs each indicating an enlarged portion of laser mark 61, in the case where the surface roughness of a base portion of metal layer 20X is low and in the case where the surface roughness of the same is high. FIG. 22 shows an example of laser mark 61 provided by the disclosed method, and micrographs each indicating an enlarged portion of laser mark 61, in the case where the surface roughness of a base portion of metal layer 20 is low and in the case where the surface roughness of the same is high.

As shown in FIG. 21, it is clear that the roughness of the base portion of metal layer 20X affects the visibility of laser mark 61 in conventional method A. Specifically, in conventional method A, since metal layer 20X and laser mark 61 achieve the substantially same roughness as the roughness of the base portion of metal layer 20X decreases, the visibility of laser mark 61 is reduced.

On the other hand, as shown in FIG. 22, it is clear that the roughness of the base portion of metal layer 20 does not affect the visibility of laser mark 61 in the disclosed method. This is because the disclosed method achieves an excellent visibility of laser mark 61 due to the difference in color between outline portion 22b and central portion 22a or base portion 22c. In other words, the disclosed method makes it possible to ensure the excellent visibility of laser mark 61 regardless of the roughness of base portion 22c.

Next, a suitable size of laser mark 61 provided by the disclosed method is described with reference to FIG. 23. FIG. 23 is a diagram for describing one marking line by a laser beam and the size of one letter when laser mark 61 is provided by the disclosed method.

As shown in FIG. 23, the laser beam is moved when laser mark 61 is provided. Here, the line width (W) of one marking line in one laser mark 61 is expressed as the sum of the line width (2r) of central portion 22a and doubling (×2) of the line width (Δr) of outline portion 22b (an outline portion on one side). To put it another way, W=2×r+2×Δr.

Here, one laser mark 61 is provided within a predefined rectangular region. FIG. 23 shows a case in which the letter "m" is provided as laser mark 61 within the predefined rectangular region.

Here, when outline portion 22b of laser mark 61 has a wide line width, lines (marking lines) constituting laser mark 61 (letter) overlap each other, which reduces the visibility. Specifically, the letter indicating laser mark 61 is collapsed and is not easily distinguished as a letter. For this reason, although it becomes more difficult to provide laser mark 61 clearly as laser mark 61 becomes smaller in size, since laser mark 61 provided by the disclosed method is a combination of central portion 22a and outline portion 22b on both sides of central portion 22a, even when laser mark 61 is small, laser mark 61 has an advantage in visibility compared to a laser mark not including central portion 22a.

However, even when small laser mark 61 is provided by the disclosed method, the following two points are essential in order to ensure enough visibility.

First, it is essential that outline portions 22b do not overlap each other on adjacent marking lines. For example, even when a character of laser mark 61 provided is "m", "M", "E", "W", "5", "6", or the like, at most three marking lines may run in parallel with each other in one rectangular region indicating the letter size. This is because there are no letters of the English alphabet and no numerals that exceed three marking lines.

Second, it is essential that outline portion 22b is prevented from being relatively eroded by central portion 22a too much (i.e., the line width of central portion 22a is prevented from becoming too wide), and conversely, outline portion 22b is prevented from being the only remaining portion (i.e., the line width of central portion 22a is prevented from becoming too narrow).

With regard to one marking line when laser mark 61 is provided by a laser beam, the inventors obtained experimental results shown in Table 4 below.

TABLE 4

| Laser irradiation conditions | Narrow width condition | Typical condition | Wide width condition |
|---|---|---|---|
| Line width W of one marking line = Line width 2r of central portion + Line width Δr × 2 of outline portion on one side | 38 μm | 50 μm | 100 μm |
| Line width of central portion (=2r) | 14 μm | 20 μm | 50 μm |
| Smaller letter size ※ It is possible to mark letters larger than the above size. | 114 μm | 150 μm | 300 μm |
| (Line width of one marking line − Line width of central portion)/ Line width of one marking line | 0.63 | 0.6 | 0.5 |

Specifically, as shown in Table 4, first, it was found that line width W (=2r+2Δr) of one marking line may be at least 38 μm and at most 100 μm. In this case, the line width (2r) of central portion 22a may be at least 14 μm and at most 50 μm, and the line width (Δr) of an outline portion on one side of the one marking line may be at least 12 μm and at most 25 μm. As an example, line width W of the one marking line is 50 μm, the line width of central portion 22a is 20 μm, and the line width of the outline portion on the one side of the one marking line is 15 μm.

Moreover, according to a study based on the above-described lower limit conditions, it was found that, when laser mark 61 having a small letter size is provided, the letter size (rectangular region) may have a width of at least 114 μm and a height of at most 300 μm.

The letter size (rectangular region) of laser mark 61 is typically 150 μm, and may be at least 150 μm. In other words, a predefined rectangular region when laser mark 61 is provided may have a width and a height of at least 150 μm. Accordingly, it is possible to ensure the visibility of laser mark 61. This is because three times the line width of one marking line achievable under that condition is the lower limit of the letter size of laser mark 61 that can be provided. To put it another way, setting the letter size of laser mark 61 to at least 150 μm causes adjacent marking lines not to overlap each other, and thus it is possible to prevent the visibility of laser mark 61 from decreasing. That is to say, there is a character having a predefined letter size, and laser mark 61 that fits to the letter size (i.e., visible) is limited to a laser irradiation condition under which the line width of one marking line is ⅓ of the size.

Therefore, the line width of the one marking line of laser mark 61 may be less than ⅓ of a smaller one of the width or height of the predefined rectangular region on which one laser mark 61 is provided. Accordingly, even when laser mark 61 is small in size, it is possible to provide clear laser mark 61 that is not collapsed.

Furthermore, when line width W of the one marking line of laser mark 61 becomes wider, both r and Δr become wider. However, according to a condition under which the line width of central portion 22a becomes widest among laser irradiation conditions confirmed as being capable of ensuring the visibility of a character in the disclosed method, by setting a relative line width of only outline portion 22b on the one marking line (i.e., (line width of one marking line−line width of central portion 22a)/line width of one marking line) to at least 0.5, it is possible to prevent the visibility of laser mark 61 from decreasing due to excessive narrowing of the line width of only outline portion 22b. Conversely, when line width W of the one marking line of laser mark 61 becomes too narrow, there is a possibility that the visibility of laser mark 61 decreases due to narrowing of the line width of central portion 22a. Therefore, according to the condition under which the line width of central portion 22a becomes narrowest among the laser irradiation conditions confirmed as being capable of ensuring the visibility of the character in the disclosed method, the upper limit of "(line width of one marking line−line width of central portion 22a)/line width of one marking line" may be 0.63. In view of the above, "(line width of one marking line−line width of central portion 22a)/line width of one marking line" may be at least 0.50 and at most 0.63 (0.6 as a typical example).

Figure 24:
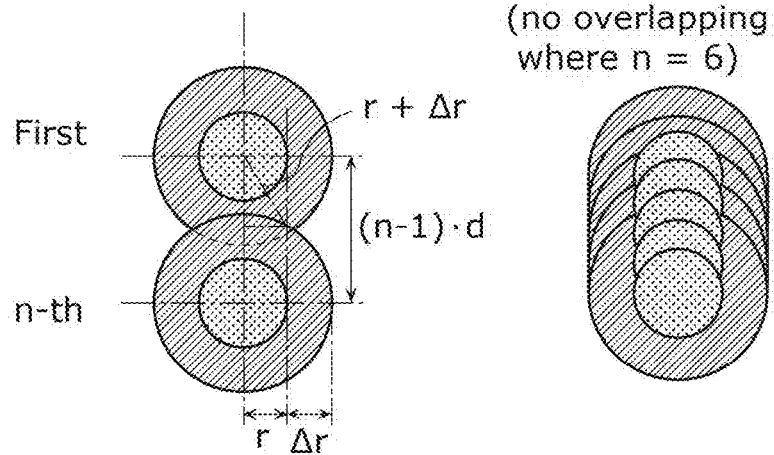
FIG. 24 is a diagram illustrating a state in which two adjacent laser irradiation spots overlap each other multiple times contiguously in the laser marking method according to the embodiment.

Next, the control of blackening of outline portion 22b in laser mark 61 is described with reference to FIG. 24. FIG. 24 is a diagram illustrating a state in which two adjacent laser irradiation spots overlap each other multiple times contiguously in the disclosed method. The left part of FIG. 24 shows the first and n-th laser irradiation spots (laser irradiation spots therebetween omitted) when n laser irradiation spots overlap each other, where n is an integer greater than or equal to 2. The right part of FIG. 24 shows a state in which five (n=5) laser irradiation spots overlap each other.

It is possible to control the blackness (shades of black) of outline portion 22b in laser mark 61 by increasing or decreasing the number of overlapping laser irradiation spots. Specifically, the blackness of outline portion 22b increases with an increase in the number of overlapping laser irradiation spots.

As shown in FIG. 24, in laser mark 61 provided by the disclosed method, central portion 22a is provided by circular laser irradiation spots having radius r that are contiguously provided with distance d in between centers of two adjacent laser irradiation spots, and outline portion 22b is provided by contiguous annular regions and each of which has width Δr and is obtained by removing a circle having radius r from a circle that has radius r+Δr and is concentric with a corresponding one of the circular laser irradiation spots. Here, in a plan view, two adjacent laser irradiation spots include mutually overlapping portions, and the overlapping portions are located outward of the circle having radius r.

In order to achieve the above, the first laser irradiation spot and the n-th laser irradiation spot may include overlapping portions outward of the circle having radius r, and radius r, width Δr, and distance d may geometrically satisfy the following relation.

$$d = 2*\Delta r/(n-1)*(2r/\Delta r + 1)^{1/2}$$

Here, according to the experimental results of the inventors, it was found that, with regard to n overlapping laser irradiation spots, the lower limit of n (i.e., the upper limit of distance d) may be 7, and the upper limit of n (i.e., the lower limit of distance d) may be 45.

When n<7, overlapping portions of laser irradiation spots become insufficient, and the blackness of outline portion 22b is reduced. Specifically, outline portion 22b has a luminance of at most 0.65, and the luminance of outline portion 22b becomes similar to a luminance of central portion 22a. As a result, the differences in color and luminance between outline portion 22b and central portion 22a become blurred, and thus the visibility of laser mark 61 decreases. It should be noted that a luminance refers to a brightness obtained by numerically converting, with black as 0 and white as 1, image data captured in 256 levels of gray. Although each of the pixels has a numerical value, in the present disclosure, an average value of the numerical values of 180 pixels equivalent to the area of 405 μm×405 μm is used as an index and is sometimes referred to as an average luminance. Additionally, a microscope and a camera in which one pixel is 1.5 μm are used to capture an image.

In contrast, when n>45, although the blackness of outline portion 22b is sufficient, overlapping portions continue excessively, and there is a high possibility of affecting physical processing by a laser beam or of causing structural breakdown due to an increase in temperature.

As stated above, radius r, width Δr, and distance d may satisfy $d=2*\Delta r/(n-1)*(2r/\Delta r+1)^{1/2}$ and $7 \leq n \leq 45$. Accordingly, it is possible to blacken outline portion 22b and at the same time whiten central portion 22a while ensuring that central portion 22a has a certain width. Consequently, it is possible to reduce the indistinctness of laser mark 61 and increase the visibility of laser mark 61.

In this case, typically, n=16 may be set. Accordingly, it is possible to prevent the influence on physical processing by the laser beam or the structural breakdown due to the increase in temperature while maintaining the appropriate blackness (e.g., a luminance of at most 0.42) of outline portion 22b Moreover, distance d may satisfy 1 μm≤d≤8 μm. Accordingly, it is possible to not only increase the visibility of laser mark 61 by blackening outline portion 22b and whitening central portion 22a, but also intend to reduce the time required for a laser marking step. Furthermore, radius r may satisfy 7 μm≤r≤25 μm, and width Δr may satisfy 12 μm≤Δr≤25 μm. As an example, d=3 μm, r=10 μm, Δr=15 μm, and n=16 are set. In this case, θ=81.4°, and outline portion 22b has a luminance of 0.42.

Furthermore, distance d and radius r may satisfy $d=2*\Delta r/(n-1)*(2r/\Delta r+1)^{1/2}$ and $7 \leq n \leq 45$, and at the same time may also satisfy $d=2r*\cos\theta$ and $66° \leq \theta \leq 87°$ as described above.

Figure 25:
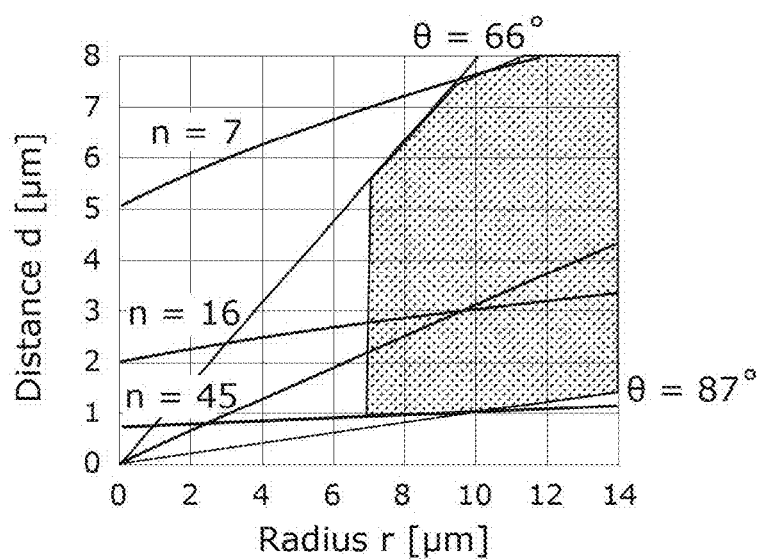
FIG. 25 is a graph illustrating a relation between radius r of a laser irradiation spot, distance d between two adjacent laser irradiation spots, number n of a plurality of overlapping laser irradiation spots, and angle θ in FIG. 7 in the laser marking method according to the embodiment.

Here, since radius r may satisfy 7 μm≤r≤25 μm as stated above, a suitable range for distance d and radius r is a range indicated by the shade area in FIG. 25. For example, when radius r=10 μm, as shown in FIG. 25, a suitable range of distance d is from at least approximately 1 μm to at most approximately 8 μm. It should be noted that it is possible to control radius r and Δr by adjusting a laser beam irradiation intensity, a laser beam focal length, etc. as described above.

Moreover, it is possible to control distance d [μm] by appropriately setting a frequency [kHz] of a laser beam and a moving speed [mm/sec] of the laser beam as stated above. Here, when a frequency of a laser beam is denoted by a [kHz] and a moving speed of the laser beam is denoted by b [mm/sec], distance d [μm] is represented by d=b/a.

Figure 26:
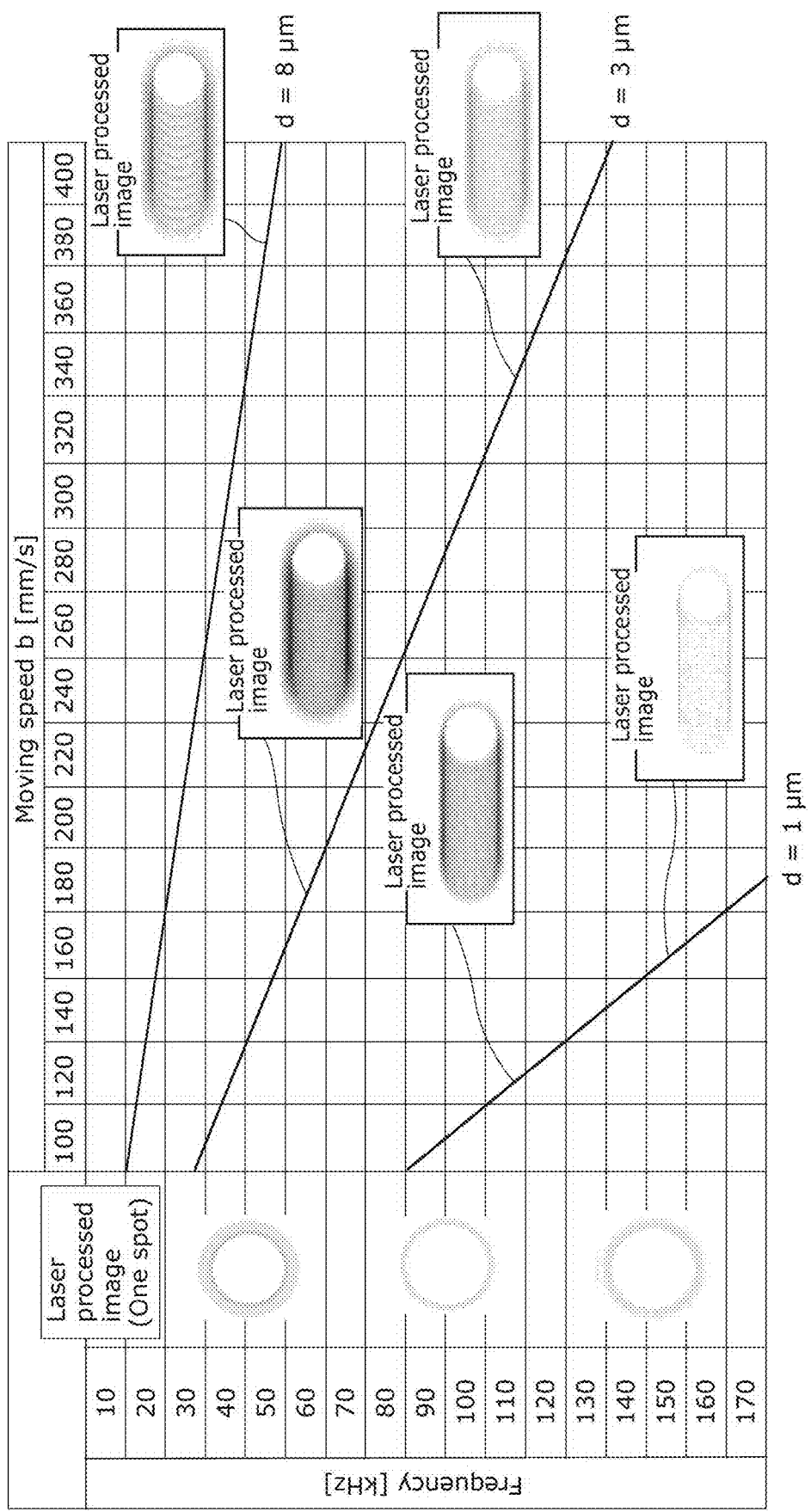
FIG. 26 is a graph illustrating a relation between distance d between two adjacent laser irradiation spots, frequency a of a laser beam, and moving speed b of the laser beam in the laser marking method according to the embodiment.

FIG. 26 shows a relation between distance d, frequency a of a laser beam, and moving speed b of the laser beam.

A moving speed is a moving speed of a laser irradiator that radiates a laser beam or a moving speed of semiconductor device 1 to which a laser beam is radiated. When the moving speed becomes slow, it takes time to complete a laser marking step. For example, when the moving speed becomes less than 100 [mm/sec], the efficiency of the laser marking step decreases.

A frequency is the number of laser beam irradiations per second when a pulse laser radiates laser beams. Since an irradiation intensity per laser beam shot (irradiation) decreases with an increase in frequency, it becomes difficult to thinly etch the metal layer corresponding to central portion 22a by a laser beam, and at the same time it becomes difficult to provide outline portion 22b (oxidized region) by oxidizing the metal layer. For example, when laser mark 61 is provided by radiating a laser beam at a high frequency of 130 [kHz] to 150 [kHz], the visibility of laser mark 61 decreases.

As stated above, in the disclosed method, a prescribed condition for the moving speed and the frequency when laser mark 61 is provided by pulse radiating the laser beam may be a 130 [kHz], b≥100 [mm/sec], and 1.0≤b/a≤8.0. Accordingly, it is possible to further increase the visibility of laser mark 61 by blackening outline portion 22b and whitening central portion 22a, and at the same time intend to further reduce the time required for the laser marking step.

It should be noted that, in the disclosed method, although an essential element when outline portion 22b of laser mark 61 is provided is distance d, even when distance d remains constant, a distinction between black and white per laser irradiation spot becomes clearer with a decrease in frequency, and thus the visibility of laser mark 61 increases. In other words, in FIG. 26, among conditions indicated by a straight line of the same d, a suitable condition is a condition in a direction in which a frequency decrease (a direction toward the upper left).

As described above, the laser marking method according to the present embodiment is a method for providing laser mark 61 on the exposed surface of metal layer 20 (specifically second metal layer 22), and includes: sequentially pulse radiating a laser beam to the exposed surface of metal layer 20 under a prescribed condition to cause a first action and a second action in parallel, and providing laser mark 61 including outline portion 22b and central portion 22a, the first action increasing a degree of oxidization of outline portion 22b defining an outline of laser mark 61, compared to base portion 22c that is in the exposed surface of metal layer 20 and unaffected by the laser beam radiated, the second action decreasing a degree of oxidization of central portion 22a of laser mark 61 located inward of outline portion 22b, compared to base portion 22c in the exposed surface of metal layer 20.

Accordingly, even when metal layer 20 is difficult to etch by the laser beam because metal layer 20 contains a metal material having a high melting point or is thick, it is possible to make a color of outline portion 22b different from a color of base portion 22c or a color of central portion 22a, and thus it is possible to provide recognizable laser mark 61 on metal layer 20. In addition, since the laser marking method according to the present embodiment makes it possible to simultaneously provide central portion 22a and outline portion 22b in parallel by one laser beam irradiation, it is possible to reduce the time required for the laser marking step.

Semiconductor device 1 according to the present embodiment is a facedown mountable, chip-size-package type semiconductor device, and includes: semiconductor substrate 11; and metal layer 20 that is disposed on semiconductor substrate 11 and is exposed to outside. One or more laser marks 61 each including central portion 22a and outline portion 22b are provided on an exposed surface of metal layer 20. In a plan view of the exposed surface of metal layer 20, outline portion 22b has a color different from a color of base portion 22c or from a color of central portion 22a.

This configuration makes it possible to provide recognizable laser mark 61 on metal layer 20 even when metal layer 20 is difficult to etch by a laser beam.

[Variations]

Although the semiconductor device and the laser marking method etc. according to the present disclosure have been described based on the embodiment above, the present disclosure is not limited to the above-described embodiment.

For example, although code 60 provided on metal layer 20 of semiconductor device 1 includes a combination of laser marks 61 that are separated from each other in the above-described embodiment, the present disclosure is not limited to this example. For example, code 60 may be obtained by combining a plurality of laser marks 61 in contact with each other. As an example, code 60 may be a two-dimensional barcode including a combination of laser marks 61 that are a plurality of figures.

Moreover, although the exposed surface of semiconductor device 1 on which laser mark 61 is provided is the bottom surface (back surface) of second metal layer 22 in the above-described embodiment, the present disclosure is not limited to this example. For example, laser mark 61 may be provided on a side surface of second metal layer 22 or first metal layer 21 or on an exposed surface of first gate pad 54a, first source pad 56a, second gate pad 54b, or second source pad 56b. To put it another way, it is possible to provide laser mark 61 on an exposed surface of a metal component as long as the exposed surface of the metal component is exposed to the outside and contains a metal material.

Furthermore, although semiconductor device 1 is the dual type semiconductor device including the two vertical MOS transistors in the above-described embodiment, the present disclosure is not limited to this example. For example, semiconductor device 1 may be a single type semiconductor device including one vertical MOS transistor.

Moreover, although the transistors of semiconductor device 1 are the vertical MOS transistors in the above-described embodiment, the present disclosure is not limited to this example. For example, the transistors of semiconductor device 1 may be lateral (planar) MOS transistors. In addition, the transistors of semiconductor device 1 are not limited to FETs, and semiconductor device 1 itself is not limited to a semiconductor device including transistors. Semiconductor device 1 may include a metal component on which laser mark 61 is provided.

Forms obtained by various modifications to the above-described embodiment that can be conceived by a person skilled in the art as well as forms achieved by arbitrarily combining the constituent elements and functions in the embodiment within the scope of the essence of the present disclosure are included in the present disclosure.

INDUSTRIAL APPLICABILITY

The technique disclosed in the present disclosure is useful for various devices such as a semiconductor device on which a laser mark is provided.

The invention claimed is:

1. A semiconductor device that is a facedown mountable, chip-size-package type semiconductor device, the semiconductor device comprising:
   a semiconductor substrate; and
   a metal layer that is disposed on the semiconductor substrate and is exposed to outside,
   wherein one or more marks are provided on an exposed surface of the metal layer,
   the one or more marks each include an outline portion defining an outline of the mark, and a central portion located inward of the outline portion,
   a surface oxygen content of the metal layer in the outline portion is higher than a surface oxygen content of the metal layer in the central portion,
   a main component of the metal layer is at least one of nickel, magnesium, aluminum, chrome, or copper,
   the outline portion and the central portion are exposed, and
   the metal layer has a thickness of at least 2 μm.

2. A semiconductor device that is a facedown mountable, chip-size-package type semiconductor device, the semiconductor device comprising:
   a semiconductor substrate; and
   a metal layer that is disposed on the semiconductor substrate and is exposed to outside,
   wherein one or more marks are provided on an exposed surface of the metal layer,
   the one or more marks each include an outline portion defining an outline of the mark, and a central portion located inward of the outline portion,
   a surface light absorption coefficient of the metal layer in the outline portion is different from a surface light absorption coefficient of the metal layer in the central portion,
   a main component of the metal layer is at least one of nickel, magnesium, aluminum, chrome, or copper,
   the outline portion and the central portion are exposed, and
   the metal layer has a thickness of at least 2 μm.

3. The semiconductor device according to claim 1 or claim 2,
   wherein a surface oxygen content of the metal layer is highest in the outline portion.

4. The semiconductor device according to claim 1 or claim 2,
   wherein when a surface oxygen content of the metal layer in the outline portion is denoted by A, a surface oxygen content of the metal layer in a base portion is denoted by B, and a surface oxygen content of the metal layer in the central portion is denoted by C, A>B≥C is satisfied, the base portion being a portion of the exposed surface of the metal layer on which the one or more marks are not provided.

5. The semiconductor device according to claim 1 or claim 2,
   wherein a surface composition of the metal layer in the outline portion is different from at least one of a surface composition of the metal layer in a base portion or a surface composition of the metal layer in the central portion, the base portion being a portion of the exposed surface of the metal layer on which the one or more marks are not provided.

6. The semiconductor device according to claim 1 or claim 2,
wherein a width of one marking line for each of the one or more marks is less than one-third of a smaller one of a width or a height of a predefined rectangular region in which one mark is provided.

7. The semiconductor device according to claim 1 or claim 2,
wherein the central portion is provided by circular laser irradiation spots that are contiguously provided with a distance d in between centers of two adjacent laser irradiation spots, the circular laser irradiation spots each having a radius r, and
the radius r and the distance d satisfy $d=2r*\cos\theta$ and $66°\leq\theta\leq87°$.

8. The semiconductor device according to claim 1 or claim 2,
wherein the central portion is provided by circular laser irradiation spots that are contiguously provided with a distance d in between centers of two adjacent laser irradiation spots, the circular laser irradiation spots each having a radius r,
the outline portion is provided by contiguous annular regions, the annular regions each having a width $\Delta r$ and being obtained by removing a circle having the radius r from a circle that has a radius $r+\Delta r$ and is concentric with a corresponding one of the circular laser irradiation spots, and
the radius r, the width $\Delta r$, and the distance d satisfy $d=2*\Delta r/(n-1)*(2r/\Delta r+1)^{1/2}$ and $7\leq n\leq 45$.

9. The semiconductor device according to claim 7, wherein the distance d satisfies $1\ \mu m\leq d\leq 8\ \mu m$.

10. A laser marking method for providing a mark on an exposed surface of a metal layer that contains at least one of nickel, magnesium, aluminum, chrome, or copper and has a thickness of at least 2 μm, the laser marking method comprising:
sequentially pulse radiating a laser beam to the exposed surface of the metal layer under a prescribed condition to cause a first action and a second action in parallel, and providing the mark including an outline portion and a central portion,
wherein the first action includes increasing a degree of oxidization of the outline portion defining an outline of the mark, compared to a base portion that is in the exposed surface of the metal layer and unaffected by the radiation of the laser beam, and
the second action includes decreasing a degree of oxidization of the central portion of the mark located inward of the outline portion, compared to the base portion in the exposed surface of the metal layer.

11. The laser marking method according to claim 10,
wherein the outline portion is provided by overlapping an oxidized region multiple times on the exposed surface of the metal layer, the oxidized region being created in a peripheral region of a laser irradiation spot of the laser beam by the first action.

12. The laser marking method according to claim 10,
wherein the outline portion is provided to cause an oxygen mass concentration measured by EDX to exceed 3%.

13. The laser marking method according to claim 10,
wherein when a frequency of the laser beam is denoted by a [KHz] and a moving speed of the laser beam is denoted by b [mm/sec], the prescribed condition is $a\leq 130$ kHz, $b\geq 100$ mm/sec, and $1.0\leq b/a\leq 8.0$.

* * * * *